US008101335B2

(12) United States Patent
Harada et al.

(10) Patent No.: US 8,101,335 B2
(45) Date of Patent: *Jan. 24, 2012

(54) RESIST COMPOSITION AND PATTERNING PROCESS

(75) Inventors: Yuji Harada, Joetsu (JP); Jun Hatakeyama, Joetsu (JP); Kazunori Maeda, Joetsu (JP); Koji Hasegawa, Joetsu (JP); Satoshi Shinachi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 319 days.

This patent is subject to a terminal disclaimer.

(21) Appl. No.: 12/463,751

(22) Filed: May 11, 2009

(65) Prior Publication Data

US 2009/0280434 A1 Nov. 12, 2009

(30) Foreign Application Priority Data

May 12, 2008 (JP) ................................. 2008-124476

(51) Int. Cl.
*G03F 7/004* (2006.01)
*G03F 7/30* (2006.01)

(52) U.S. Cl. ..................... 430/270.1; 430/326; 430/905; 430/910

(58) Field of Classification Search ............... 430/270.1, 430/326, 905, 910
See application file for complete search history.

(56) References Cited

U.S. PATENT DOCUMENTS

| | | | |
|---|---|---|---|
| 5,541,037 A | 7/1996 | Hatakeyama et al. | |
| 5,714,625 A | 2/1998 | Hada et al. | |
| 6,004,724 A | 12/1999 | Yamato et al. | |
| 6,063,953 A | 5/2000 | Hada et al. | |
| 6,261,738 B1 | 7/2001 | Asakura et al. | |
| 6,312,867 B1 | 11/2001 | Kinsho et al. | |
| 6,512,020 B1 | 1/2003 | Asakura et al. | |
| 6,869,744 B2 | 3/2005 | Hatakeyama | |
| 6,916,591 B2 | 7/2005 | Ohsawa et al. | |
| 7,125,943 B2 * | 10/2006 | Sumida et al. | 526/308 |
| 7,244,545 B2 | 7/2007 | Takebe et al. | |
| 7,399,577 B2 | 7/2008 | Yamato et al. | |
| 7,402,626 B2 * | 7/2008 | Maeda et al. | 524/544 |
| 7,455,952 B2 | 11/2008 | Hatakeyama et al. | |
| 7,531,289 B2 * | 5/2009 | Kinsho et al. | 430/270.1 |
| 7,759,440 B2 * | 7/2010 | Miyazawa et al. | 526/245 |
| 7,887,990 B2 * | 2/2011 | Isono et al. | 430/270.1 |
| 2006/0008736 A1 | 1/2006 | Kanda et al. | |
| 2006/0246373 A1 | 11/2006 | Wang | |
| 2007/0122736 A1 | 5/2007 | Hatakeyama et al. | |
| 2007/0166639 A1 | 7/2007 | Araki et al. | |
| 2008/0032202 A1 | 2/2008 | Ishizuka et al. | |
| 2009/0053650 A1 | 2/2009 | Irie | |

FOREIGN PATENT DOCUMENTS

| | | |
|---|---|---|
| JP | 60-38821 A | 2/1985 |
| JP | 62-62520 A | 3/1987 |
| JP | 62-62521 A | 3/1987 |
| JP | 6-273926 A | 9/1994 |
| JP | 9-95479 A | 4/1997 |
| JP | 9-208554 A | 8/1997 |
| JP | 9-230588 A | 9/1997 |
| JP | 9-246173 A | 9/1997 |
| JP | 9-301948 A | 11/1997 |
| JP | 2803549 B2 | 7/1998 |
| JP | 2906999 B2 | 4/1999 |
| JP | 2000-314956 A | 11/2000 |
| JP | 2000-336121 A | 12/2000 |
| JP | 2005-264131 A | 9/2005 |
| JP | 2006-48029 A | 2/2006 |
| JP | 2006-91798 A | 4/2006 |
| JP | 2006-133716 A | 5/2006 |
| JP | 2006-309245 A | 11/2006 |
| JP | 2007-140446 A | 6/2007 |
| JP | 2007-187887 A | 7/2007 |
| WO | WO-2004/074242 A2 | 9/2004 |
| WO | WO-2005/042453 A1 | 5/2005 |
| WO | WO-2005/069676 A1 | 7/2005 |

OTHER PUBLICATIONS

Proc. SPIE, vol. 4690, xxix, Abstract, 2002.
Owa et al., "Immersion lithography; its potential performance and issues", Optical Microlithography XVI, Proceedings of SPIE, vol. 5040, 2003, p. 724.
Hirayama, "Resist and Cover Material Investigation for Immersion Lithography", 2nd Immersion Workshop, 2003.
Allen et al., "Design of Protective Topcoats for Immersion Lithography", Journal of Photopolymer Science and Technology, vol. 18, No. 5, 2005, pp. 615-619.
Nakano et al., "Defectivity data taken with a full-field Immersion exposure tool", 2nd International symposium on Immersion Lithography, Sep. 13, 2005.
Ito et al., "Aliphatic platforms for the design of 157 nm chemically amplified resists", Advances in Resist Technology and Processing XIX, Proceedings of SPIE, vol. 4690, 2002, p. 18.
Murase et al., "Neuer Begriff und ein Nano-Hybrid System für Hydrophobie", XXIV FATIPEC Congress Book, vol. 1 B, p. B-15 (1997).
Murase et al., "Characterization of molecular interfaces in hydrophobic systems", Progress in Organic Coatings, vol. 31, 1997, pp. 97-104.
Arimitsu et al., "Sensitivity Enhancement of Chemical-Amplification-Type Photoimaging Materials by Acetoacetic Acid Derivatives", Journal of Photopolymer Science and Technology, vol. 8, No. 1, 1995, pp. 43-44.
Kudo et al., Enhancement of the Senesitivity of Chemical-Amplification-Type Photoimaging Materials by β-Tosyloxyketone Acetals, Journal of Photopolymer Science and Technology, vol. 8, No. 1, 1995, pp. 45-46.
Arimitsu et al., "Effect of Phenolic Hydroxyl Residues on the Improvement of Acid-Proliferation-Type Photoimaging Materials", Journal of Photopolymer Science and Technology, vol. 9, No. 1, 1996, pp. 29-30.

\* cited by examiner

*Primary Examiner* — John Chu

(74) *Attorney, Agent, or Firm* — Birch, Stewart, Kolasch & Birch, LLP

(57) ABSTRACT

A copolymer of an alkali-soluble (α-trifluoromethyl)-acrylate and a norbornene derivative is useful as an additive to a resist composition. When processed by immersion lithography, the resist composition exhibits excellent water repellency and water slip and forms a pattern with few development defects.

12 Claims, No Drawings

RESIST COMPOSITION AND PATTERNING PROCESS

CROSS-REFERENCE TO RELATED APPLICATION

This non-provisional application claims priority under 35 U.S.C. §119(a) on Patent Application No. 2008-124476 filed in Japan on May 12, 2008, the entire contents of which are hereby incorporated by reference.

TECHNICAL FIELD

This invention generally relates to a photolithography process for the microfabrication of semiconductor devices, and particularly to an immersion photolithography process involving directing ArF excimer laser radiation having a wavelength of 193 nm from a projection lens toward a resist-coated substrate, with a liquid (e.g., water) intervening between the lens and the substrate. More particularly, it relates to a resist composition for use in the lithography process and a process for forming a pattern using the same.

BACKGROUND ART

In the recent drive for higher integration and operating speeds in LSI devices, the pattern rule is made drastically finer. The background supporting such a rapid advance is a reduced wavelength of the light source for exposure. The change-over from i-line (365 nm) of a mercury lamp to shorter wavelength KrF laser (248 nm) enabled mass-scale production of dynamic random access memories (DRAM) with an integration degree of 64 MB (processing feature size $\leq 0.25$ μm). To establish the micropatterning technology necessary for the fabrication of DRAM with an integration degree of 256 MB and 1 GB or more, the lithography using ArF excimer laser (193 nm) is under active investigation. The ArF excimer laser lithography, combined with a high NA lens (NA $\geq 0.9$), is considered to comply with 65-nm node devices. For the fabrication of next 45-nm node devices, the $F_2$ laser lithography of 157 nm wavelength became a candidate. However, because of many problems including a cost and a shortage of resist performance, the employment of $F_2$ lithography was postponed. ArF immersion lithography was proposed as a substitute for the $F_2$ lithography. Efforts have been made for the early introduction of ArF immersion lithography (see Proc. SPIE, Vol. 4690, xxix, 2002).

In the ArF immersion lithography, the space between the projection lens and the wafer is filled with water and ArF excimer laser is irradiated through the water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE, Vol. 5040, p 724, 2003).

Several problems arise when a resist film is exposed in the presence of water. For example, the acid once generated from a photoacid generator and a basic compound added to the resist material can be partially leached in water. As a result, pattern profile changes and pattern collapse can occur. It is also pointed out that water droplets remaining on the resist film, though in a minute volume, can penetrate into the resist film to generate defects.

These drawbacks of the ArF immersion lithography may be overcome by providing a protective coating between the resist film and water to prevent resist components from being leached out and water from penetrating into the resist film (see 2nd Immersion Workshop: Resist and Cover Material Investigation for Immersion Lithography, 2003).

With respect to the protective coating on the photoresist film, a typical antireflective coating on resist (ARCOR) process is disclosed in JP-A 62-62520, JP-A 62-62521, and JP-A 60-38821. The ARCs are made of fluorinated compounds having a low refractive index, such as perfluoroalkyl polyethers and perfluoroalkyl amines. Since these fluorinated compounds are less compatible with organic substances, fluorocarbon solvents are used in coating and stripping of protective coatings, raising environmental and cost issues.

Other resist protective coating materials under investigation include water-soluble or alkali-soluble materials. See, for example, JP-A 6-273926, Japanese Patent No. 2,803,549, and J. Photopolymer Sci. and Technol., Vol. 18, No. 5, p 615, 2005. Since the alkali-soluble resist protective coating material is strippable with an alkaline developer, it eliminates a need for an extra stripping unit and offers a great cost saving. From this standpoint, great efforts have been devoted to develop water-insoluble resist protective coating materials, for example, resins having alkali-soluble groups such as fluorinated alcohol, carboxyl or sulfo groups on side chains. See WO 2005/42453, WO 2005/69676, JP-A 2005-264131, JP-A 2006-133716, and JP-A 2006-91798.

As means for preventing resist components from being leached out and water from penetrating into the resist film without a need for a protective coating material, it is proposed in JP-A 2006-48029, JP-A 2006-309245, and JP-A 2007-187887 to add an alkali-soluble, hydrophobic compound as a surfactant to the resist material. This method achieves equivalent effects to the use of resist protective coating material because the hydrophobic compound is segregated at the resist surface during resist film formation. Additionally, this method is economically advantageous over the use of a resist protective film because steps of forming and stripping the protective film are unnecessary.

The ArF immersion lithography systems commercially available at the present are designed such that water is partly held between the projection lens and the wafer rather than immersing the resist-coated substrate fully in water, and exposure is carried out by scanning the wafer-holding stage at a speed of 300 to 550 nm/sec. In the event of such high-speed scanning, unless the performance of the resist or protective film is sufficient, water cannot be held between the projection lens and the wafer, and water droplets are left on the surface of the resist film or protective film after scanning. It is believed that residual droplets cause defective pattern formation.

To eliminate the droplets remaining on the surface of the photoresist or protective film after scanning, it is necessary to improve the flow or mobility of water (hereinafter, water slip) on the relevant coating film. It is reported that the number of defects associated with the immersion lithography can be reduced by increasing the receding contact angle of the photoresist or protective film with water. See 2nd International Symposium on Immersion Lithography, Sep. 12-15, 2005, Defectivity data taken with a full-field immersion exposure tool, Nakano et al.

One exemplary material known to have excellent water slip and water repellency on film surface is a copolymer of α-trifluoromethylacrylate and norbornene derivative (Proc. SPIE, Vol. 4690, p 18, 2002). While this polymer was developed as the base resin for $F_2$ (157 nm) lithography resist materials, it is characterized by a regular arrangement of molecules of α-trifluoromethylacrylate (effective for water repellency improvement) and norbornene derivative in a ratio of 2:1.

When a water molecule interacts with methyl and trifluoromethyl groups, it orients via its oxygen and hydrogen atoms, respectively, and the orientation distance between water and methyl is longer, as discussed in XXIV FATIPEC Congress Book, Vol. B, p 15 (1997) and Progress in Organic Coatings, 31, p 97-104 (1997). A resin having not only water repellent fluorinated units introduced, but also both fluoroalkyl and alkyl groups incorporated is improved in water slip because of a longer orientation distance of water. In fact, a polymer having a regular arrangement of water repellent monomeric units like the above-referred copolymer of α-trifluoromethylacrylate and norbornene derivative is used as the base polymer in a protective coating for immersion lithography, water slip is drastically improved (see US 20070122736 or JP-A 2007-140446).

A material having good water slip performance is also required from the standpoint of productivity. The immersion lithography needs higher throughputs than ever. For improved productivity, the exposure time must be reduced, which in turn requires high-speed scanning operation of the stage. In order to move the stage at a high speed while holding water beneath the lens, it is desired to have a resist material or resist protective film having higher water slip performance.

The highly water repellent/water slippery materials discussed above are expected to be applied not only to the ArF immersion lithography, but also to the resist material for mask blanks. Resist materials for mask blanks suffer from problems including a change of sensitivity during long-term exposure in vacuum and long-term stability after coating. With respect to the control of sensitivity changes in vacuum, an improvement is made by a combination of acid labile groups of acetal and tertiary ester types (U.S. Pat. No. 6,869,744). It is believed that after coating of a resist material, an amine component is adsorbed to the resist film surface whereby the resist varies its sensitivity or profile. A method of modifying the surface of a resist film for preventing adsorption of an amine component to the resist film has been devised.

Hydrophobic surfactants for use in resist protective coatings and resist materials are allegedly effective in overcoming a pattern profile change, referred to as "dark-bright difference," which is considered problematic in many types of lithography including immersion lithography, dry lithography and EB lithography. The dark-bright difference is a phenomenon that the profile of a line-and-space pattern differs between a bright pattern where a peripheral portion around the pattern is exposed and a dark pattern where a peripheral portion around the pattern is not exposed. When a peripheral portion around the pattern is exposed, the acid generated in the peripheral portion can evaporate during PEB to cover the pattern area, whereby the line pattern undergoes a film slimming. When a peripheral portion around the pattern is not exposed, no acid is supplied from the peripheral portion and inversely, amine evaporates whereby the line pattern takes a bulged top profile. The "dark-bright difference" occurs by this mechanism. The dark-bright difference can be reduced by providing a protective coating on the resist film.

| Citation List | |
|---|---|
| Patent Document 1: | JP-A S62-62520 |
| Patent Document 2: | JP-A S62-62521 |
| Patent Document 3: | JP-A S60-38821 |
| Patent Document 4: | JP-A H06-273926 |

-continued

| Citation List | |
|---|---|
| Patent Document 5: | JP 2803549 |
| Patent Document 6: | WO 2005/42453 |
| Patent Document 7: | WO 2005/69676 |
| Patent Document 8: | JP-A 2005-264131 |
| Patent Document 9: | JP-A 2006-133716 |
| Patent Document 10: | U.S. Pat. No. 7,455,952 (JP-A 2006-91798) |
| Patent Document 11: | JP-A 2006-048029 |
| Patent Document 12: | JP-A 2006-309245 |
| Patent Document 13: | JP-A 2007-187887 |
| Patent Document 14: | US 20070122736 (JP-A 2007-140446) |
| Patent Document 15: | U.S. Pat. No. 6,869,744 |
| Non-Patent Document 1: | Proc. SPIE, Vol. 4690, xxix, 2002 |
| Non-Patent Document 2: | Proc. SPIE, Vol. 5040, p724, 2003 |
| Non-Patent Document 3: | 2nd Immersion Workshop: Resist and Cover Material Investigation for Immersion Lithography (2003) |
| Non-Patent Document 4: | J. Photopolymer Sci. and Technol., Vol. 18, No. 5, p615, 2005 |
| Non-Patent Document 5: | 2nd International Symposium on Immersion Lithography, 12-15 Sept., 2005, Defectivity data taken with a full-field immersion exposure tool, Nakano et al. |
| Non-Patent Document 6: | Proc. SPIE, Vol. 4690, p18 (2002) |
| Non-Patent Document 7: | XXIV FATIPEC Congress Book, Vol. B, p15 (1997) |
| Non-Patent Document 8: | Progress in Organic Coatings, 31, p97-104 (1997) |

SUMMARY OF INVENTION

An object of the invention is to provide a resist composition which has improved water repellency and water slip and suffer from few development defects; an additive polymer essential to achieve such performance; and a pattern forming process using the composition.

The inventors have discovered that a copolymer of an alkali-soluble (α-trifluoromethyl)acrylate and a norbornene derivative, designated polymer P1, P1', P1" or P2 (collectively referred to as polymer PA) is useful as an additive to a photoresist composition for immersion lithography.

Accordingly, the present invention provides a resist composition and a pattern forming process, as defined below.

In a first aspect, the invention provides a resist composition comprising (A) a polymer P1 comprising repeat units of the following general formulae (1a) and (2a), (B) a polymer having a structure containing one or both of a lactone ring and a hydroxyl group, and/or a structure derived from maleic anhydride, which polymer becomes soluble in an alkaline developer under the action of an acid, (C) a compound capable of generating an acid upon exposure to high-energy radiation, and (D) an organic solvent.

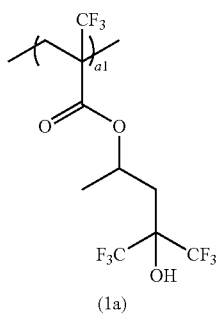

(1a)

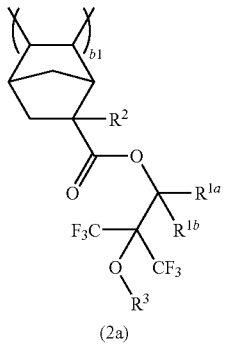

(2a)

Herein $R^{1a}$ and $R^{1b}$ are hydrogen or straight, branched or cyclic $C_1$-$C_{10}$ alkyl, $R^{1a}$ and $R^{1b}$ may bond together to form a non-aromatic ring with the carbon atom to which they are attached, $R^2$ is hydrogen, methyl or trifluoromethyl, $R^3$ is hydrogen or an acid labile group, a1 and b1 are numbers satisfying $0<a1<1$, $0<b1<1$, and $0<a1+b1\leqq 1$.

In a second aspect, the invention provides a resist composition comprising (A) a polymer P1' comprising repeat units of the following general formulae (1a), (1b) and (2a), (B) a polymer having a structure containing one or both of a lactone ring and a hydroxyl group, and/or a structure derived from maleic anhydride, which polymer becomes soluble in an alkaline developer under the action of an acid, (C) a compound capable of generating an acid upon exposure to high-energy radiation, and (D) an organic solvent.

P1'

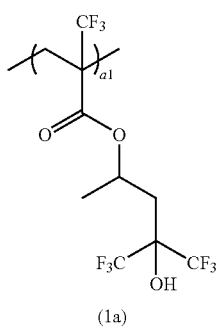

(1a)

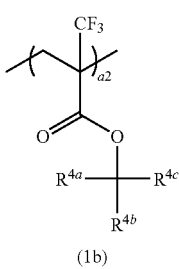

(1b)

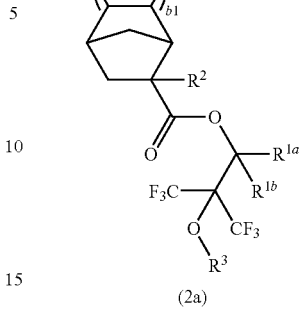

(2a)

Herein $R^{1a}$, $R^{1b}$, $R^2$ and $R^3$ are as defined above, $R^{4a}$ to $R^{4c}$ are hydrogen or straight, branched or cyclic $C_1$-$C_{10}$ alkyl, and a1, a2 and b1 are numbers satisfying $0<a1<1$, $0<a2<1$, $0<b1<1$, and $0<a1+a2+b1\leqq 1$.

In a third aspect, the invention provides a resist composition comprising (A) a polymer P1" comprising repeat units of the following general formulae (1a), (1b), (2a) and (2b), (B) a polymer having a structure containing one or both of a lactone ring and a hydroxyl group, and/or a structure derived from maleic anhydride, which polymer becomes soluble in an alkaline developer under the action of an acid, (C) a compound capable of generating an acid upon exposure to high-energy radiation, and (D) an organic solvent.

P1"

Herein $R^{1a}$, $R^{1b}$, $R^2$, $R^3$, and $R^{4a}$ to $R^{4c}$ are as defined above, $R^5$ is straight, branched or cyclic $C_1$-$C_{10}$ alkyl, and a1, a2, b1 and b2 are numbers satisfying $0<a1<1$, $0\leqq a2<1$, $0\leqq b1<1$, $0<b2<1$, and $0<a1+a2+b1+b2\leqq 1$.

In a fourth aspect, the invention provides a resist composition comprising (A) a polymer P2 corresponding to a polymer P1-H comprising repeat units of the following general formulae (1a) and (2a') wherein some or all of hydroxyl groups in formulae (1a) and (2a') are protected with protective groups, (B) a polymer having a structure containing one or both of a lactone ring and a hydroxyl group, and/or a structure derived from maleic anhydride, which polymer becomes soluble in an alkaline developer under the action of an acid, (C) a compound capable of generating an acid upon exposure to high-energy radiation, and (D) an organic solvent.

P1-H

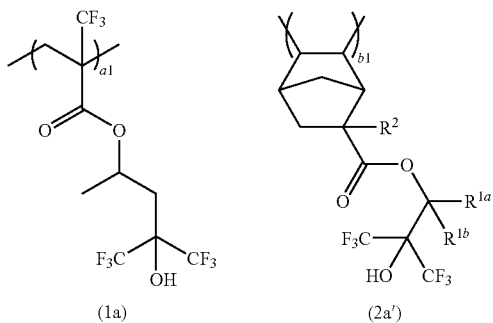

(1a)                    (2a')

Herein $R^{1a}$, $R^{1b}$, $R^2$, a1 and b1 are as defined above.

In any of the foregoing aspects, the resist composition may further comprise (E) a basic compound and/or (F) a dissolution inhibitor.

In a fifth aspect, the invention provides a pattern forming process comprising the steps of (1) applying the resist composition defined above onto a substrate to form a resist coating, (2) heat treating the resist coating and exposing it to high-energy radiation through a photomask, and (3) developing the exposed coating with a developer;

a pattern forming process comprising the steps of (1) applying the resist composition defined above onto a substrate to form a resist coating, (2) heat treating the resist coating and exposing it to high-energy radiation from a projection lens through a photomask while holding a liquid between the substrate and the projection lens, and (3) developing the exposed coating with a developer; and a pattern forming process comprising the steps of (1) applying the resist composition defined above onto a substrate to form a resist coating, (2) forming a protective coating onto the resist coating, (3) heat treating and exposing the coated substrate to high-energy radiation from a projection lens through a photomask while holding a liquid between the substrate and the projection lens, and (4) developing with a developer.

Typically, the liquid is water; and the high-energy radiation has a wavelength in the range of 180 to 250 nm.

Also provided is a pattern forming process comprising the steps of (1) applying the resist composition defined above onto a mask blank to form a resist coating, (2) heat treating and exposing the resist coating in vacuum to electron beam, and (3) developing with a developer.

ADVANTAGEOUS EFFECTS OF INVENTION

When applied to the immersion lithography, the resist composition of the invention forms a resist film having a large receding contact angle enough to inhibit leaching-out of resist components and penetration of water into the resist film. It also ensures that the resist film is developed into a satisfactorily profiled pattern with minimal development defects.

DESCRIPTION OF EMBODIMENTS

The singular forms "a", "an" and "the" include plural references unless the context clearly dictates otherwise.

The notation (Cn-Cm) means a group containing from n to m carbon atoms per group.

A. Polymer

The polymers P1, P1' and P1" used in the resist composition of the invention are characterized by comprising repeat units having the general formulae (1a), (1b), (2a), and (2b).

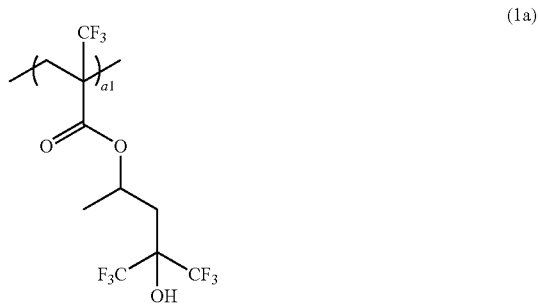

(1a)

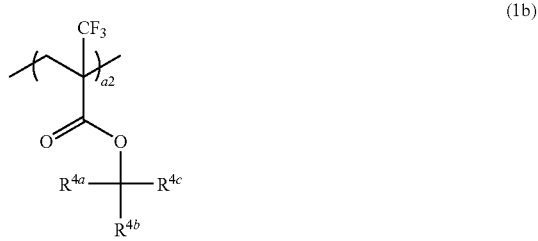

(1b)

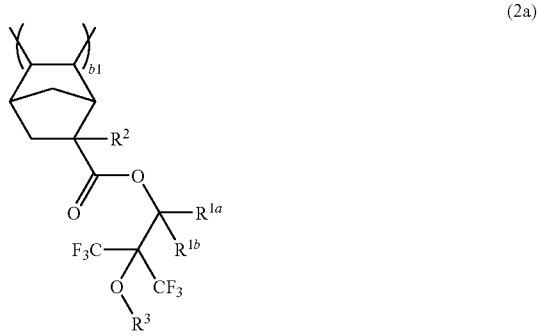

(2a)

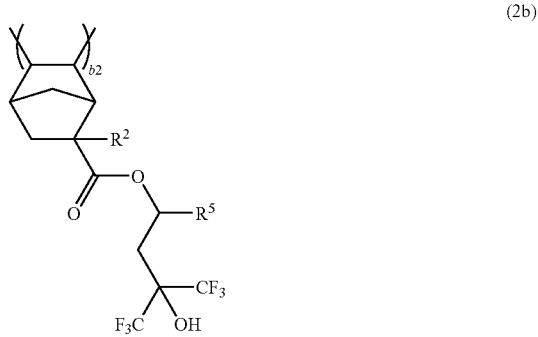

(2b)

Herein $R^{1a}$ and $R^{1b}$ are hydrogen or straight, branched or cyclic $C_1$-$C_{10}$ alkyl, or $R^{1a}$ and $R^{1b}$ may bond together to form a non-aromatic ring with the carbon atom to which they are attached. $R^2$ is hydrogen, methyl or trifluoromethyl. $R^3$ is hydrogen or an acid labile group. $R^{4a}$ to $R^{4c}$ are hydrogen or straight, branched or cyclic $C_1$-$C_{10}$ alkyl. $R^5$ is straight, branched or cyclic $C_1$-$C_{10}$ alkyl. The subscripts a1, a2, b1 and b2 are numbers satisfying $0 < a1 < 1$, $0 \leq a2 < 1$, $0 \leq b1 < 1$, $0 \leq b2 < 1$, $0 < a1+a2 < 1$, $0 < b1+b2 < 1$, and $0 < a1+a2+b1+b2 \leq 1$.

The meaning of $a1+a2+b1+b2=1$ is that in a polymer comprising repeat units (1a), (1b), (2a) and (2b), the total of repeat units (1a), (1b), (2a) and (2b) is 100 mol % based on the total amount of entire repeat units. The sum of fractions of repeat units (1a) and (1b) is preferably 20 to 80 mol %, and more preferably 30 to 70 mol %. The meaning of $a1+a2+b1+b2<1$ is that the total of repeat units (1a), (1b), (2a) and (2b) is less than 100 mol % based on the total amount of entire repeat units, indicating the inclusion of other repeat units.

In formulae (1b), (2a) and (2b), exemplary straight, branched or cyclic $C_1$-$C_{10}$ alkyl groups represented by $R^{1a}$, $R^{1b}$, $R^{4a}$ to $R^{4c}$, and $R^5$ include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. $R^{1a}$ and $R^{1b}$ may bond together to form a non-aromatic ring with the carbon atom to which they are attached, wherein each of $R^{1a}$ and $R^{1b}$ is alkylene, examples of which include the foregoing alkyl groups with one hydrogen atom eliminated, and exemplary rings include cyclopentyl and cyclohexyl.

The acid labile group represented by $R^3$ in formula (2a) may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

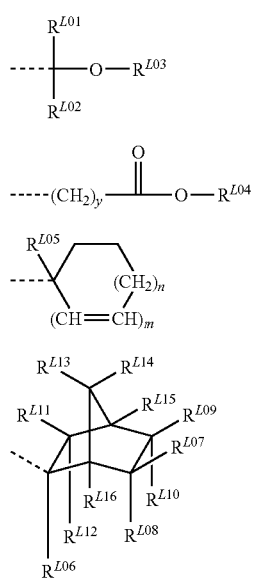

Herein, the broken line denotes a valence bond. In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

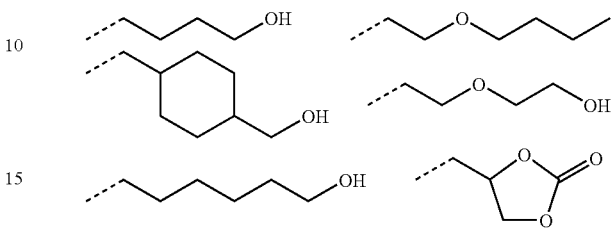

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of ring-forming $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_{10}$ alkyl group or an optionally substituted $C_6$-$C_{20}$ aryl group. Examples of the optionally substituted alkyl groups include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene groups are replaced by oxygen or sulfur atoms. Examples of optionally substituted aryl groups include phenyl, methylphenyl, naphthyl, anthryl, phenanthryl, and pyrenyl. Letter m is equal to 0 or 1, n is equal to 0, 1, 2 or 3, and 2m+n is equal to 2 or 3.

In formula (L4), $R^{L06}$ is an optionally substituted, straight, branched or cyclic $C_1$-$C_{10}$ alkyl group or an optionally substituted $C_6$-$C_{20}$ aryl group. Examples of these groups are the same as exemplified for $R^{L05}$. $R^{L07}$ to $R^{L16}$ independently represent hydrogen or monovalent hydrocarbon groups of 1 to 15 carbon atoms. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

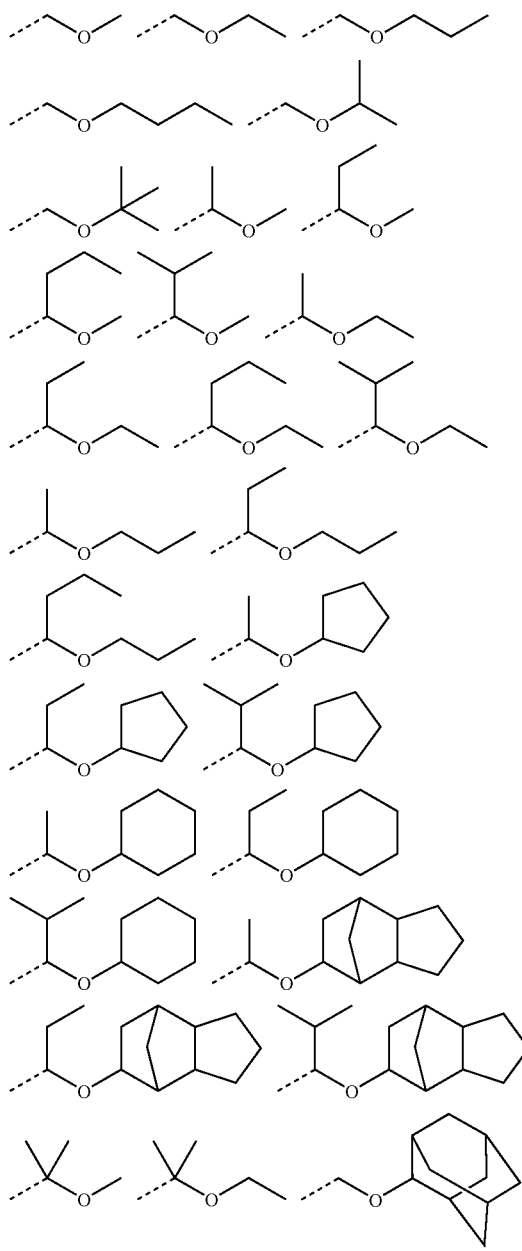

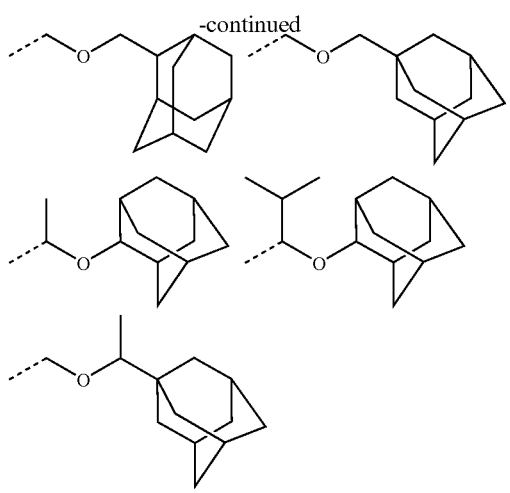

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

(L4-1)

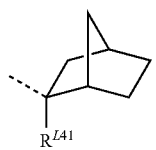

(L4-2)

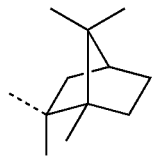

(L4-3)

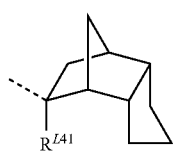

(L4-4)

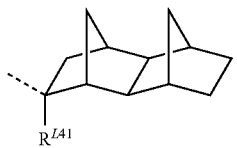

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

(L4-3-1)

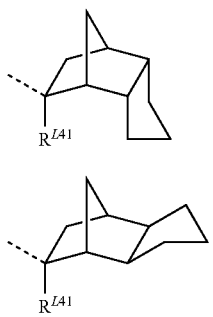

(L4-3-2)

Note that $R^{L41}$ is as defined above.

Similarly, the general formula (L4-4) represents one or a mixture of two or more selected from groups having the following general formulas (L4-4-1) to (L4-4-4).

(L4-4-1)

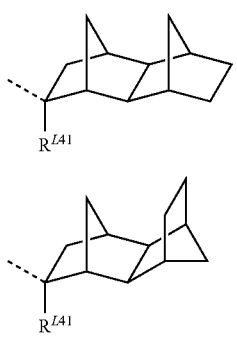

(L4-4-2)

(L4-4-3)

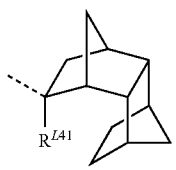

(L4-4-4)

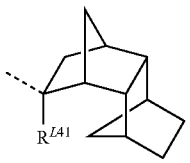

Note that $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)

(L4-2-endo)

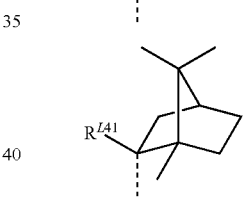

(L4-3-endo)

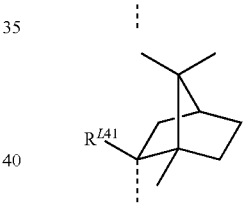

(L4-4-endo)

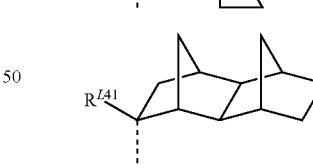

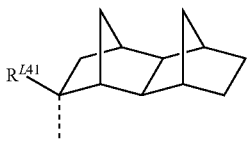

Note that $R^{L41}$ is as defined above.

Illustrative examples of the acid labile group of formula (L4) are given below

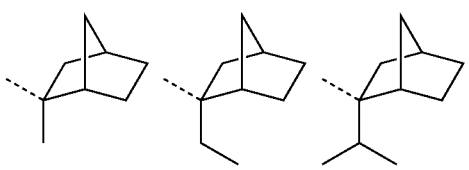

-continued

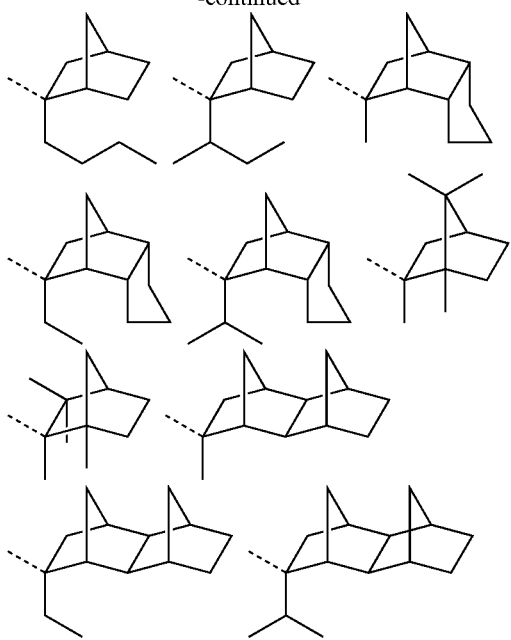

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $R^3$, are as exemplified for $R^{LO4}$ and the like.

In the resist composition of the fourth aspect, the base polymer may be a polymer P2 corresponding to a polymer P1-H comprising repeat units of the general formulae (1a) and (2a') as essential units wherein some or all of hydroxyl groups in either one or both of formula (1a) and formula (2a') are protected with protective groups. It is acceptable that some or all hydroxyl groups in formulae (1a) and (2a') be protected with protective groups.

P1-H

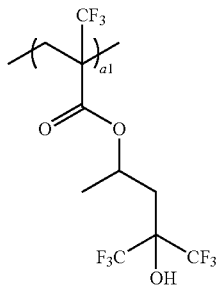

(1a)

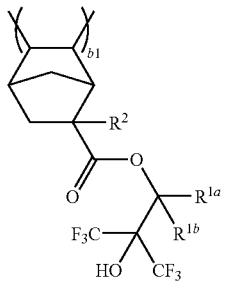

(2a')

Herein $R^{1a}$ and $R^{1b}$ are hydrogen or straight, branched or cyclic $C_1$-$C_{10}$ alkyl, or $R^{1a}$ and $R^{1b}$ may bond together to form a non-aromatic ring with the carbon atom to which they are attached. $R^2$ is hydrogen, methyl or trifluoromethyl. The subscripts a1 and b1 are numbers satisfying 0<a1<1, 0<b1<1, and 0<a1+b1≦1.

As in the foregoing embodiment, the meaning of a1+b1=1 is that the total of repeat units (1a) and (2a') is 100 mol % based on the total amount of entire repeat units. A proportion of repeat units (1a) is preferably 20 to 80 mol %, and more preferably 30 to 70 mol %. The meaning of a1+b1<1 is that the total of repeat units (1a) and (2a') is less than 100 mol % based on the total amount of entire repeat units, indicating the inclusion of other repeat units.

In formula (2a'), exemplary straight, branched or cyclic $C_1$-$C_{10}$ alkyl groups represented by $R^{1a}$ and $R^{1b}$ include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. $R^{1a}$ and $R^{1b}$ may bond together to form a ring as described above, wherein each of $R^{1a}$ and $R^{1b}$ is alkylene, examples of which include the foregoing alkyl groups with one hydrogen atom eliminated, and suitable rings are as exemplified above.

While the method of protecting hydroxyl groups on the polymer P1-H comprising repeat units of formulae (1a) and (2a') will be described later, the protective groups used herein include acid labile groups as illustrated for $R^3$ and straight, branched or cyclic $C_1$-$C_{10}$ alkyl groups. Exemplary straight, branched or cyclic $C_1$-$C_{10}$ alkyl groups include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl.

In the polymer P2, a degree of protection of hydroxyl groups on polymer P1-H may vary from 0 mol % to 100 mol % of the entire hydroxyl groups. As a degree of protection is increased, water slip performance such as sliding angle and receding contact angle can be enhanced. However, an excessive increase in degree of protection results in a resin having a reduced alkali dissolution rate. In practice, a polymer having a degree of protection of hydroxyl groups in the range of 0 to 60 mol %, and preferably 10 to 40 mol % is used for a balance of water slip performance and alkali dissolution rate.

Illustrative, non-limiting examples of the repeat units of formula (1b) are given below.

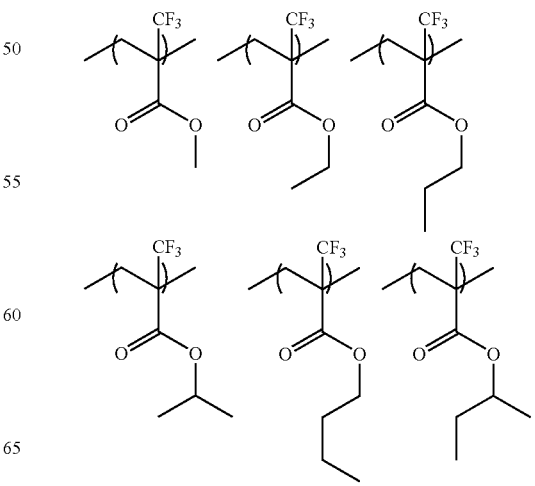

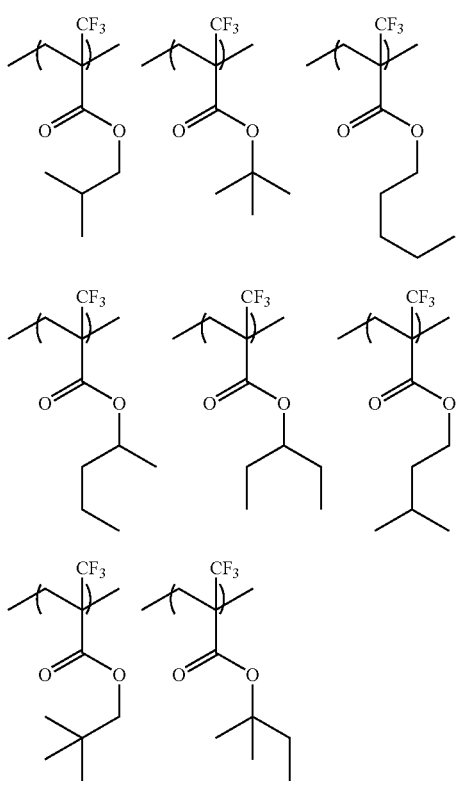
Illustrative, non-limiting examples of the repeat units of formula (2a) are given below.
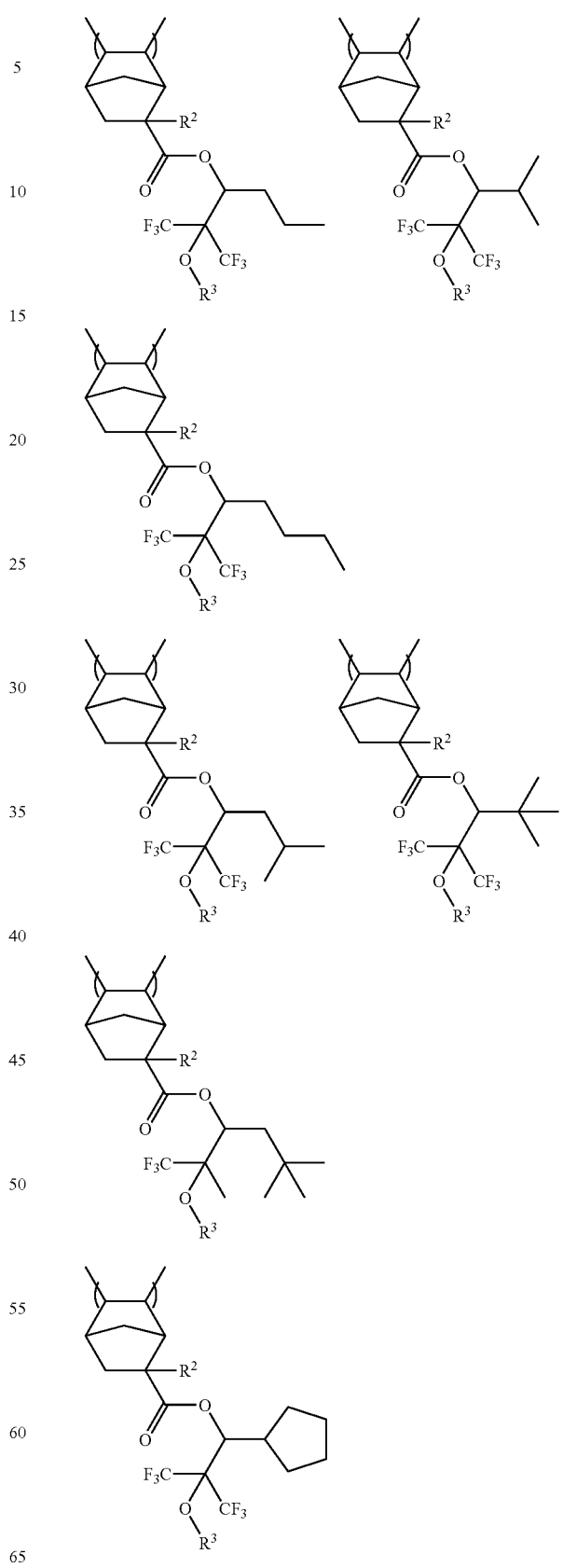

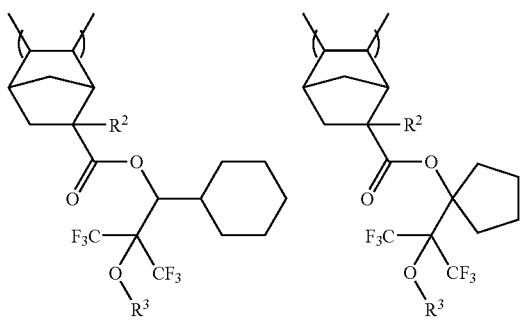
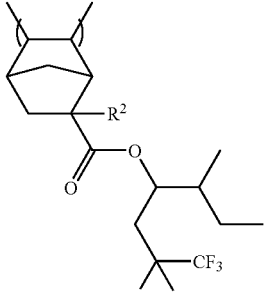
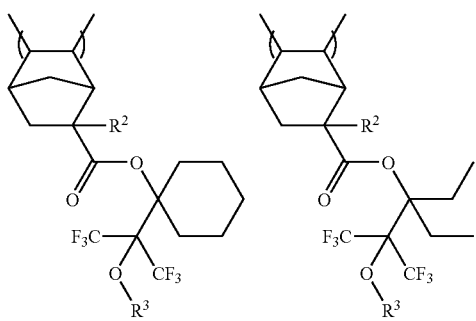
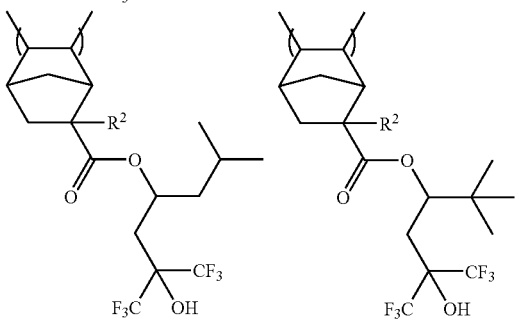

Herein R² and R³ are as defined above.

Illustrative, non-limiting examples of the repeat units of formula (2b) are given below.

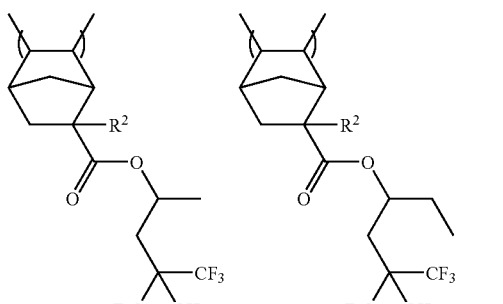
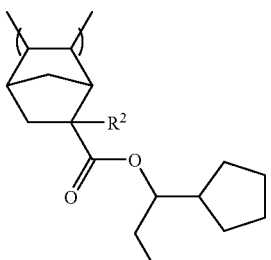
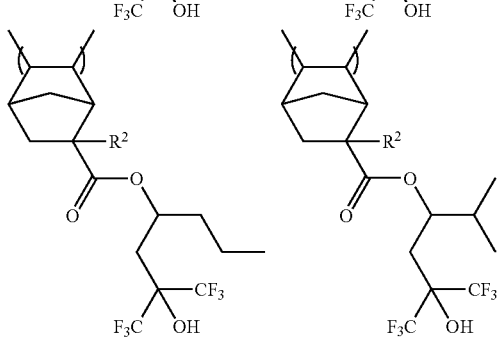
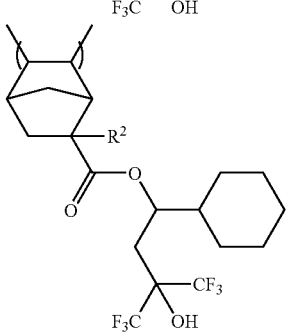
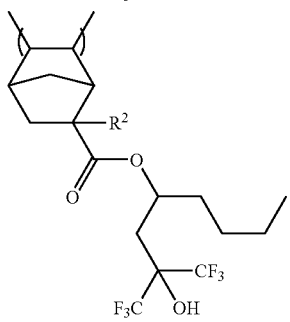

Herein R² is as defined above.

In polymer PA used in the resist composition of the invention, the repeat unit of formula (1a) contributes to water repellency and alkali solubility since it contains a hexafluoroalcohol group. The repeat units of formulae (1b), (2a) and (2b) exert excellent performance in water repellency and water slip despite poor alkali solubility. Because of a combination of these units, polymer PA exhibits excellent performance in water repellency and water slip.

It is believed that the regular arrangement of α-trifluoromethylacrylate structures and norbornene structures also contributes to the excellent water slip of polymer PA.

As discussed in the literature listed above, a water molecule orients via its oxygen atom upon interaction with a methyl group, whereas it orients via its hydrogen atom upon interaction with a trifluoromethyl group. It is reported in XXIV FATIPEC Congress Book, Vol. B, p 15 (1997) that the distances between H (methyl) and O (water molecule) and between F (trifluoromethyl) and H (water molecule) in these orientations are 0.252 nm and 0.187 nm, respectively. For better water slip performance, a longer orientation distance of a water molecule is advantageous. The above fact implies that mere introduction of fluorine into a resin fails to increase the orientation distance of a water molecule and does not lead to a dramatic improvement in water slip performance.

In contrast, in a system where methyl and trifluoromethyl groups are regularly arranged, for example, if one hydrogen atom of a water molecule orients to a trifluoromethyl group, the other hydrogen atom of water molecule is present in proximity to an adjacent methyl group, so that a repulsion force develops between H (methyl) and H (water molecule). As a result, the distance of orientation to water increases to provide an improvement in water slip performance. For the same reason, polymers having a regular arrangement of α-trifluoromethylacrylate structures and norbornene structures like polymer PA exhibit better water slip performance than polymers wherein trifluoromethyl groups are randomly distributed within the polymer structure (e.g., methacrylate polymers).

The scanning operation in the immersion lithography requires a high receding contact angle in order to prevent liquid droplets from being left backward of scanning and a low advancing contact angle in order to restrain microbubbles from being entrained forward of scanning. This necessitates a material having a little difference between advancing and receding contact angles. Polymer PA is believed promising as a hydrophobic additive for a resist material in the immersion lithography since it offers so small a sliding angle of a water droplet that it causes little deformation of a water droplet and has a little difference between advancing and receding contact angles.

Although polymer PA used in the resist composition of the invention may exert satisfactory performance by a combination of repeat units of formulae (1a), (1b), (2a), and (2b), they may also be constructed by further combining with repeat units of one or more type of the general formulae (7a) to (7e), (8a) to (8e), (9a) to (9c), and (10a) to (10c), shown below, for the purposes of imparting additional water repellency and water slip and controlling alkali solubility and developer affinity.

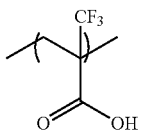
(7a)

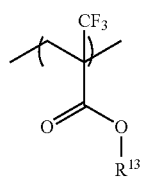
(7b)

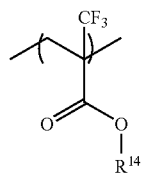
(7c)

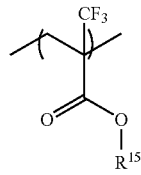

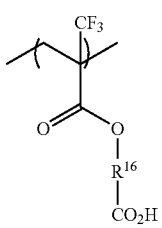
(7d)

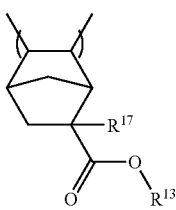
(7e)

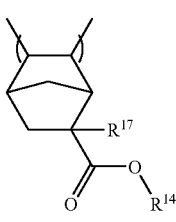
(8a)

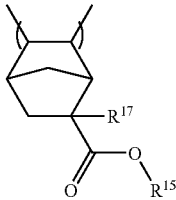
(8b)

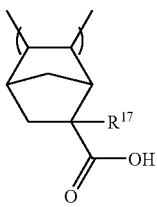
(8c)

(8d)

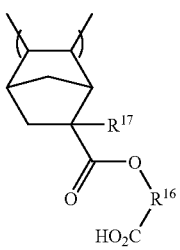
(8e)

-continued

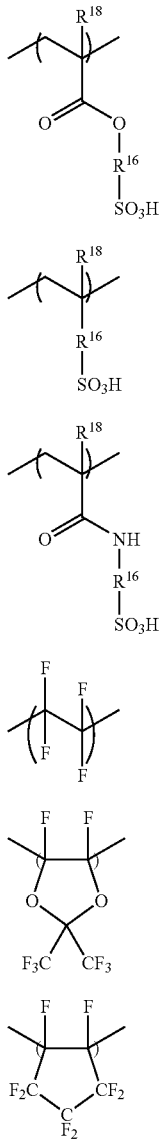

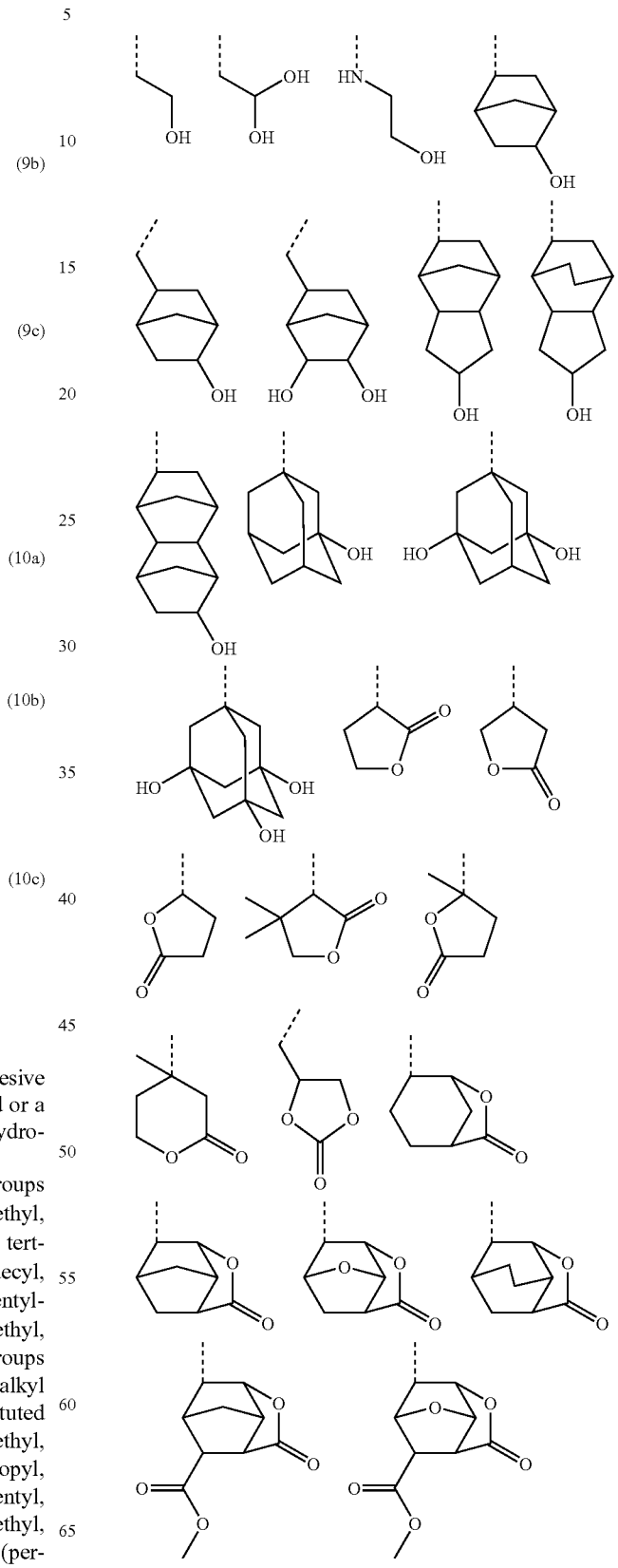

In formulae (7b) and (8b), the adhesive group represented by $R^{14}$ may be selected from a variety of such groups, typically those groups shown below.

Herein $R^{13}$ is $C_1$-$C_{10}$ alkyl or fluoroalkyl; $R^{14}$ is an adhesive group; $R^{15}$ is an acid labile group; $R^{16}$ is a single bond or a divalent $C_1$-$C_{10}$ organic group; $R^{17}$ and $R^{18}$ are each hydrogen, methyl or trifluoromethyl.

In formulae (7a) and (8a), exemplary $C_1$-$C_{10}$ alkyl groups represented by $R^{13}$ include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. Suitable fluoroalkyl groups represented by $R^{13}$ include the above-exemplified alkyl groups in which some or all hydrogen atoms are substituted by fluorine atoms, such as, for example, 2,2,2-trifluoroethyl, 3,3,3-trifluoropropyl, 1,1,2,2,3,3,3-heptafluoropropyl, 1H,1H,3H-tetrafluoropropyl, 1H,1H,5H-octafluoropentyl, 1H,1H,7H-dodecafluoroheptyl, 2-(perfluorobutyl)ethyl, 2-(perfluorohexyl)ethyl, 2-(perfluorooctyl)ethyl, and 2-(perfluorodecyl)ethyl.

-continued

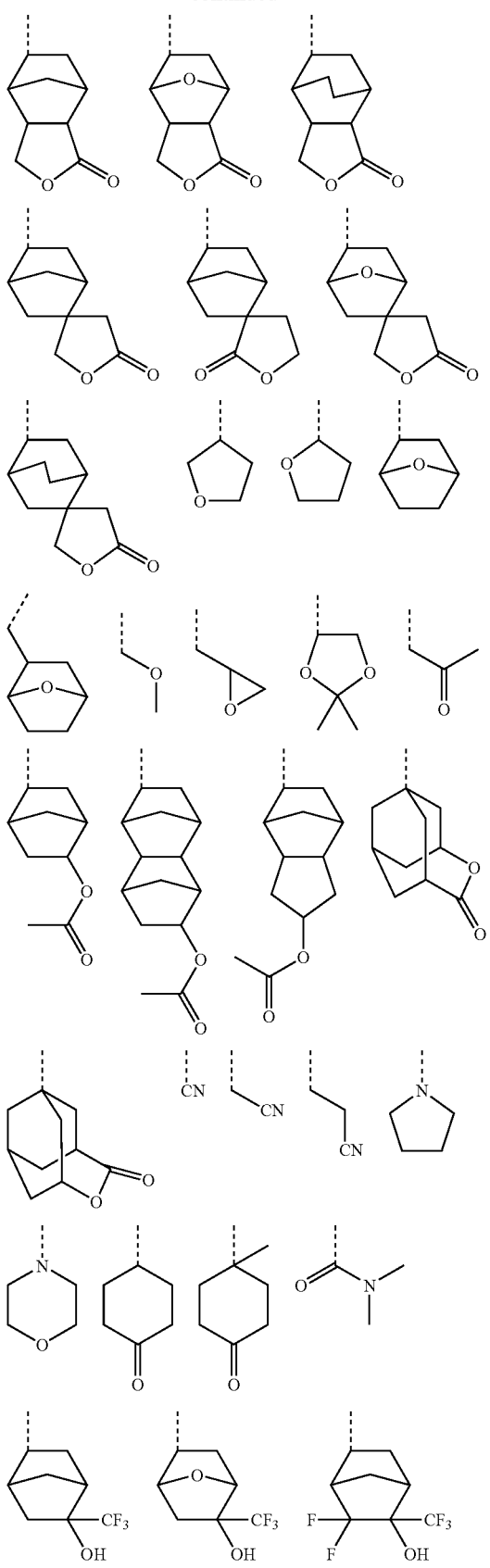

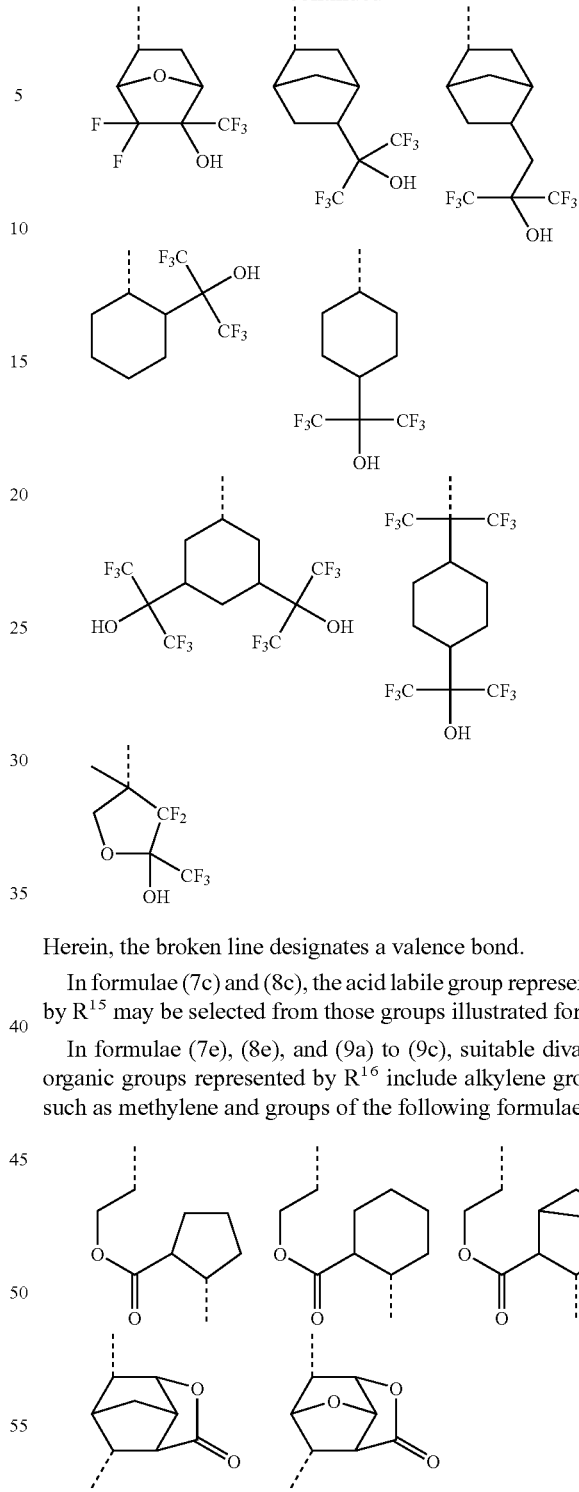

Herein, the broken line designates a valence bond.

In formulae (7c) and (8c), the acid labile group represented by $R^{15}$ may be selected from those groups illustrated for $R^3$.

In formulae (7e), (8e), and (9a) to (9c), suitable divalent organic groups represented by $R^{16}$ include alkylene groups such as methylene and groups of the following formulae.

Herein, the broken line designates a valence bond.

The polymer PA used in the resist composition may be synthesized by general polymerization processes including radical polymerization using initiators such as 2,2'-azobisisobutyronitrile (AIBN), and ionic (or anionic) polymerization using alkyllithium or the like. The polymerization may be carried out by its standard technique. Preferably the polymers are prepared by radical polymerization while the polymerization conditions may be determined in accordance with the type of initiator, temperature, pressure, concentration, solvent, additives, and the like.

Examples of the radical polymerization initiator used herein include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis(2,4,4-trimethylpentane), and dimethyl 2,2'-azobis(isobutyrate); peroxides such as tert-butylperoxypivalate, lauroyl peroxide, benzoyl peroxide, and tert-butylperoxylaurate; water-soluble polymerization initiators such as potassium persulfate; and redox initiators comprising a peroxide (e.g., potassium persulfate or hydrogen peroxide) combined with a reducing agent (e.g., sodium sulfite). Although the amount of polymerization initiator used may vary with its type and other polymerization conditions, it is generally used in an amount of 0.001 to 10 mol %, and preferably 0.01 to 5 mol % based on the total moles of monomers to be polymerized.

During the synthesis of polymer PA, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

While polymer PA may be synthesized by combining suitable monomers selected from polymerizable monomers corresponding to repeat units of formulae (1a), (1b), (2a), (2b), (7a) to (7e), (8a) to (8e), (9a) to (9c), and (10a) to (10c), adding an initiator and chain transfer agent to the monomer mixture, and effecting polymerization, a solvent may be used if necessary. Any solvent may be used as long as it does not interfere with the desired polymerization reaction. Typical solvents used herein include esters such as ethyl acetate, n-butyl acetate, and γ-butyrolactone; ketones such as acetone, methyl ethyl ketone, and methyl isobutyl ketone; aliphatic or aromatic hydrocarbons such as toluene, xylene and cyclohexane; alcohols such as isopropyl alcohol and ethylene glycol monomethyl ether; and ether solvents such as diethyl ether, dioxane, and tetrahydrofuran, which may be used alone or in admixture. Although the amount of solvent used may vary with the desired degree of polymerization (or molecular weight), the amount of initiator added, and other polymerization conditions such as polymerization temperature, it is generally used in such an amount as to provide a concentration of 0.1 to 95% by weight, preferably 5 to 90% by weight of monomers to be polymerized.

Although the temperature of the polymerization reaction may vary with the identity of polymerization initiator or the boiling point of solvent, it is preferably in the range of 20 to 200° C., and more preferably 50 to 140° C. Any desired reactor or vessel may be used for the polymerization reaction.

From the solution or dispersion of the polymer thus synthesized, the organic solvent or water serving as the reaction medium is removed by any well-known techniques. Suitable techniques include, for example, re-precipitation followed by filtration, and heat distillation under vacuum.

Polymer P2 used herein may be synthesized by synthesizing a polymer P1-H comprising repeat units of formulae (1a) and (2a'), then effecting post-protection reaction to substitute for some or all hydroxyl groups.

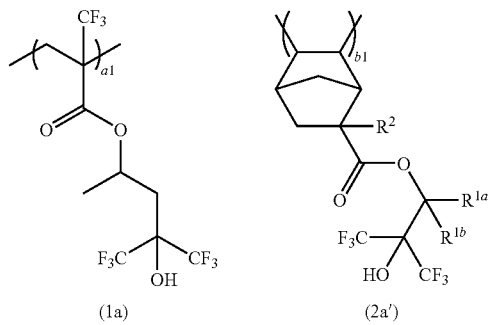

P1-H (1a)   (2a')

Herein, $R^{1a}$, $R^{1b}$, $R^2$, a1 and b1 are as defined above.

Polymer P2 is obtainable by reacting polymer P1-H with a base in an amount of 1 to 2 equivalents relative to the desired degree of substitution of hydroxyl groups, and then with R—X (wherein R is an acid labile group or alkyl as mentioned above and X is chlorine, bromine or iodine) in an amount of 1 to 2 equivalents relative to the base.

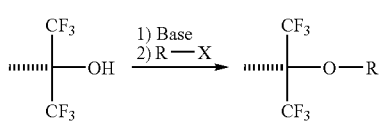

The post-protection reaction may be effected in a solvent, which is selected from hydrocarbons such as benzene and toluene, and ethers such as dibutyl ether, diethylene glycol diethyl ether, diethylene glycol dimethyl ether, tetrahydrofuran and 1,4-dioxane, alone or in admixture. Suitable bases used herein include, but are not limited to, sodium hydride, n-butyllithium, lithium diisopropylamide, triethylamine, and pyridine.

Desirably polymers PA have a weight average molecular weight (Mw) of 1,000 to 500,000, and especially 2,000 to 30,000, as determined by gel permeation chromatography (GPC) using polystyrene standards. This is because a polymer with too low a Mw may be more dissolvable in water whereas too high a Mw may interfere with film formation after spin coating and lead to a decline of alkali solubility.

In polymer PA wherein U1 stands for a total molar number of a monomer corresponding to units of formula (1a), U2 stands for a total molar number of a monomer corresponding to units of formula (1b), U3 stands for a total molar number of a monomer corresponding to units of formula (2a), and U4 stands for a total molar number of a monomer corresponding to units of formula (2b), with the proviso that U1+U2+U3+U4=UA, values of U1, U2, U3 and U4 are preferably determined so as to meet:

$0 \leq U1/UA < 1$, more preferably $0.2 \leq U1/UA \leq 0.7$, even more preferably $0.3 \leq U1/UA \leq 0.7$, $0 \leq U2/UA < 1$, more preferably $0.1 \leq U2/UA \leq 0.7$, even more preferably $0.1 \leq U2/UA \leq 0.5$, $0 \leq U3/UA < 1$, more preferably $0.1 \leq U3/UA \leq 0.6$, even more preferably $0.1 \leq U3/UA \leq 0.5$, and $0 \leq U4/UA < 1$, more preferably $0 \leq U4/UA \leq 0.7$, even more preferably $0.1 \leq U4/UA \leq 0.5$.

In the embodiment wherein additional repeat units of formulae (7a) to (7e), (8a) to (8e), (9a) to (9c), (10a) to (10c) are incorporated into the polymers for the purpose of improving their function as an additive in the resist composition, provided that U5 stands for a total molar number of monomers corresponding to the additional units and U1+U2+U3+U4+U5=UA', a ratio of UA to UA' is preferably determined so as to meet $0 \leq UA/UA' \leq 1$, more preferably $0.6 < UA/UA' \leq 1$, and even more preferably $0.8 \leq UA/UA' \leq 1$.

In the first embodiment wherein polymer PA is used as an additive to resist material, it is combined with base polymer (B) preferably in such amounts that the amount of polymer PA is 0.1 to 50 parts, more preferably 0.5 to 10 parts by weight per 100 parts by weight of polymer (B). At least 0.1 phr of polymer PA is effective in forming a photoresist film having an increased receding contact angle with water on its surface. Up to 50 phr of polymer PA ensures to form a photoresist film having a low dissolution rate in an alkaline developer, maintaining the height of a fine pattern formed therefrom.

B. Base Polymer

The resist composition is typically a chemically amplified positive resist composition. Base polymer (B) to be combined with additive polymer (A) is a polymer comprising a structure having one or both of a lactone ring and a hydroxyl group and/or a maleic anhydride-derived structure which becomes soluble in an alkaline developer under the action of an acid. Suitable polymers or base resins (B) include polymers of (meth)acrylic acid esters, copolymers of (α-trifluoromethyl)acrylate and maleic anhydride, alternating copolymers of cyclolefins and maleic anhydride, polynorbornene, cycloolefin ring-opening metathesis polymerization (ROMP) polymers, hydrogenated cycloolefin ROMP polymers, and the like.

Specifically the polymer (B) used herein includes, but is not limited to, those polymers comprising units of the following formula (R1) and/or (R2) and having a weight average molecular weight (Mw) of 1,000 to 100,000, and especially 3,000 to 30,000, as measured by GPC versus polystyrene standards.

(R1)

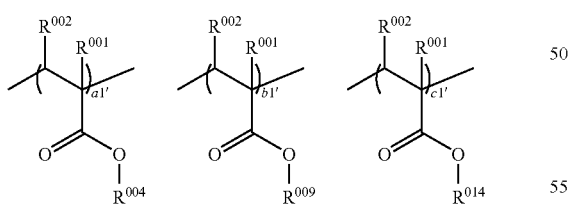

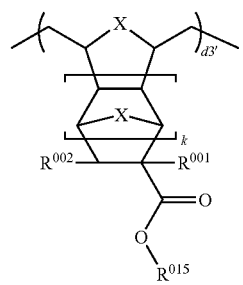

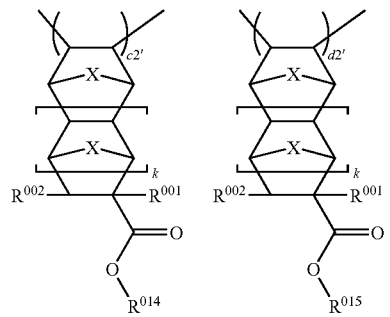

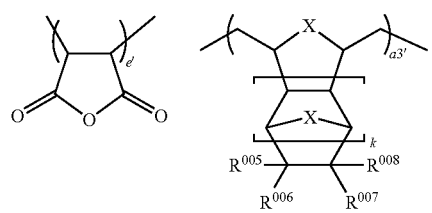

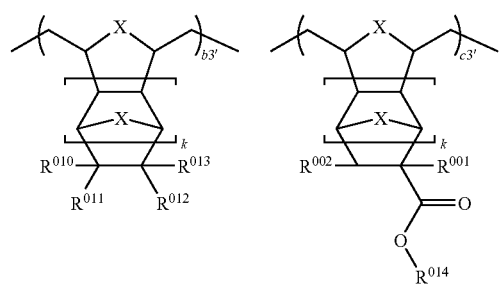

(R2)

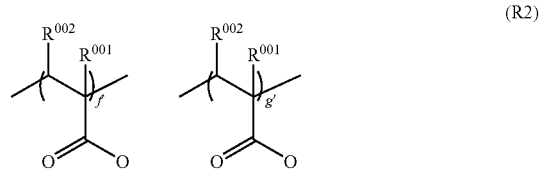

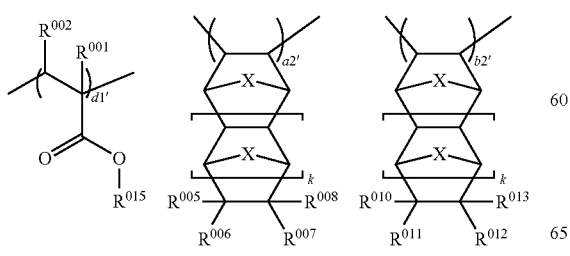

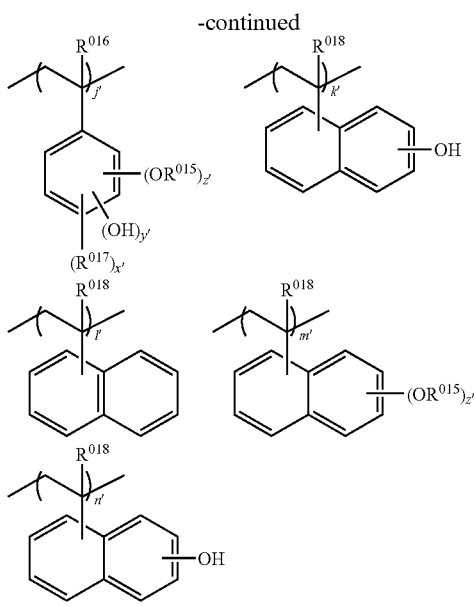

Herein, $R^{001}$ is hydrogen, methyl, trifluoromethyl or —$CH_2CO_2R^{003}$; $R^{002}$ is hydrogen, methyl or —$CO_2R^{003}$; $R^{003}$ is a straight, branched or cyclic $C_1$-$C_{15}$ alkyl; $R^{004}$ is hydrogen or a monovalent $C_1$-$C_{15}$ hydrocarbon group having a fluorinated substituent group, carboxyl group or hydroxyl group; at least one of $R^{005}$ to $R^{008}$ represents a monovalent $C_1$-$C_{15}$ hydrocarbon group having a fluorinated substituent group, carboxyl group or hydroxyl group while the remaining R's independently represent hydrogen or straight, branched or cyclic $C_1$-$C_{15}$ alkyl groups; $R^{009}$ is a monovalent $C_3$-$C_{15}$ hydrocarbon group containing a —$CO_2$— partial structure; at least one of $R^{010}$ to $R^{013}$ is a monovalent $C_2$-$C_{15}$ hydrocarbon group containing a —$CO_2$— partial structure, while the remaining R's are independently hydrogen or straight, branched or cyclic, $C_1$-$C_{15}$ alkyl groups; $R^{014}$ is a polycyclic $C_7$-$C_{15}$ hydrocarbon group or an alkyl group containing such a polycyclic hydrocarbon group; $R^{015}$ is an acid labile group; X is methylene or oxygen; $R^{016}$ and $R^{018}$ are hydrogen or methyl; $R^{017}$ is straight, branched or cyclic $C_1$-$C_8$ alkyl; and k is 0 or 1. In formula (R1), the subscripts a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1. In formula (R2), f', g', h', i', j', k', l', m' and n' are numbers from 0 to less than 1, satisfying f'+g'+h'+i'+j'+k'+l'+m'+n'=1; x', y' and z' are each an integer of 0 to 3, satisfying 1≦x'+y'+z'≦5 and 1≦y'+z'≦3.

Examples of $R^{003}$ include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

Examples of the hydrocarbon group represented by $R^{004}$ include carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, hydroxyhexafluoroisopropylcyclohexyl, and di(hydroxyhexafluoroisopropyl)cyclohexyl.

$R^{005}$ to $R^{008}$ denote monovalent $C_1$-$C_{15}$ hydrocarbon groups having a fluorinated substituent group, carboxyl group or hydroxyl group, examples of which include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, hydroxyhexafluoroisopropylcyclohexyloxycarbonyl, and di(hydroxyhexafluoroisopropyl)cyclohexyloxycarbonyl. Examples of the straight, branched or cyclic $C_1$-$C_{15}$ alkyl group are the same as exemplified for $R^{003}$. Alternatively, two of $R^{005}$ to $R^{008}$ (e.g., $R^{005}$ and $R^{006}$, $R^{006}$ and $R^{007}$) may bond together to form a ring with the carbon atom(s) to which they are attached. In that event, at least one of ring-forming $R^{005}$ to $R^{008}$ is a divalent $C_1$-$C_{15}$ hydrocarbon group having a fluorinated substituent group, carboxyl group or hydroxyl group, while the remaining are independently a single bond or a straight, branched or cyclic $C_1$-$C_{15}$ alkylene group. Examples of the divalent $C_1$-$C_{15}$ hydrocarbon group having a fluorinated substituent group, carboxyl group or hydroxyl group include the groups exemplified as the monovalent hydrocarbon group having a fluorinated substituent group, carboxyl group or hydroxyl group, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

Examples of the monovalent $C_3$-$C_{15}$ hydrocarbon group containing a —$CO_2$— partial structure, represented by $R^{009}$, include 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

Examples of the monovalent $C_2$-$C_{15}$ hydrocarbon group containing a —$CO_2$— partial structure, represented by $R^{010}$ to $R^{013}$, include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic $C_1$-$C_{15}$ alkyl groups are the same as exemplified for $R^{003}$. Alternatively, two of $R^{010}$ to $R^{013}$ (e.g., $R^{010}$ and $R^{011}$, $R^{011}$ and $R^{012}$) may bond together to form a ring with the carbon atom(s) to which they are attached. In that event, at least one of ring-forming $R^{010}$ to $R^{013}$ is a divalent $C_2$-$C_{15}$ hydrocarbon group containing a —$CO_2$— partial structure, while the remaining are independently a single bond or a straight, branched or cyclic $C_1$-$C_{15}$ alkylene group. Examples of the divalent $C_1$-$C_{15}$ hydrocarbon group containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group containing a —$CO_2$— partial structure, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

Examples of the polycyclic $C_7$-$C_{15}$ hydrocarbon group or the alkyl group containing such a polycyclic hydrocarbon group, represented by $R^{014}$, include norbornyl, bicyclo[3.3.1]nonyl, tricyclo[5.2.1.0$^{2,6}$]decyl, adamantyl, ethyladamantyl, butyladamantyl, norbornylmethyl, and adamantylmethyl.

The acid labile groups represented by $R^{015}$ may be selected from a variety of such groups. Examples of the acid labile group are groups of the general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms. Examples are the same as illustrated for the acid labile group R³ in formula (2a).

Additionally, any of indene, norbornadiene, acenaphthylene, and vinyl ether monomers may be copolymerized in the polymers of formulae (R1) and (R2).

Examples of the repeat units incorporated at compositional ratio a1' in formula (R1) are shown below, though not limited thereto.

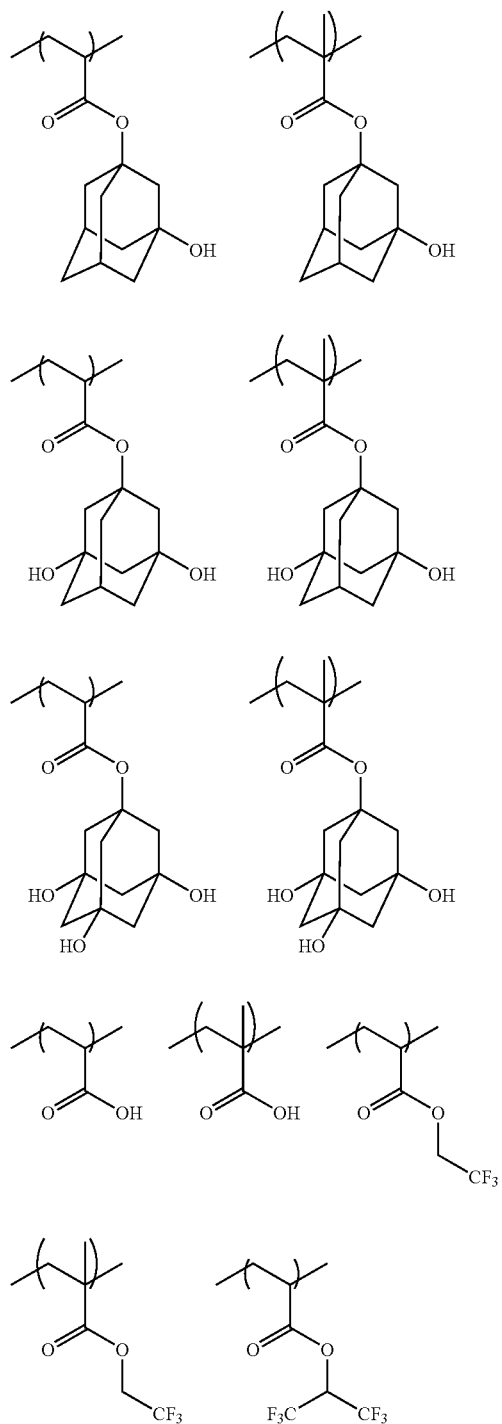

-continued

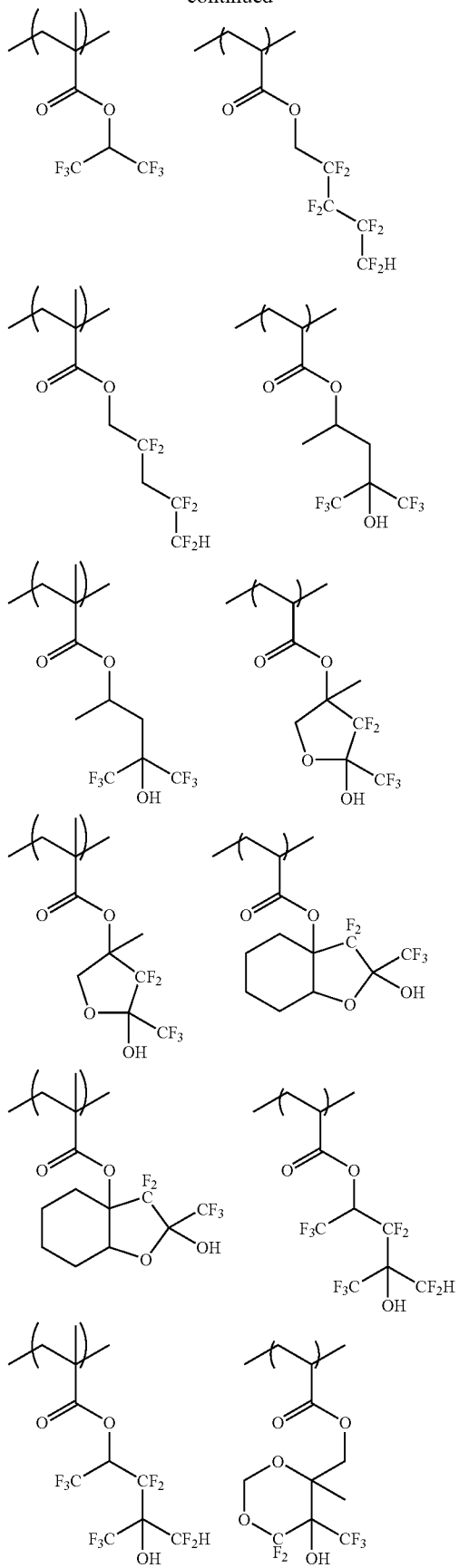

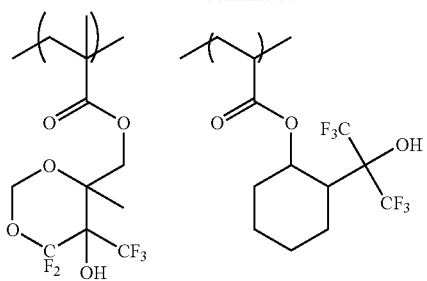
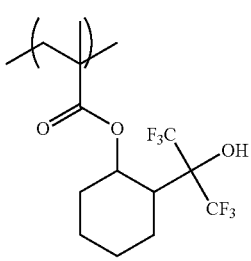
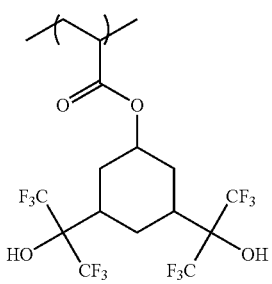
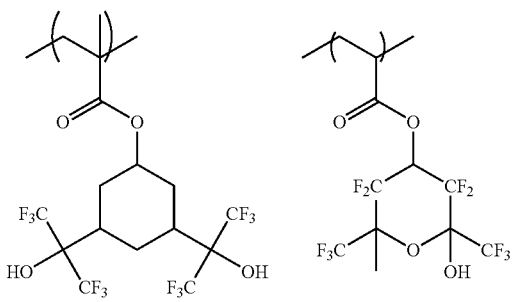
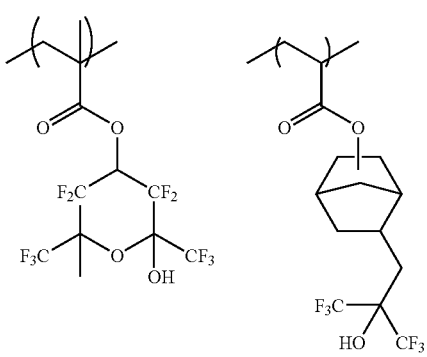
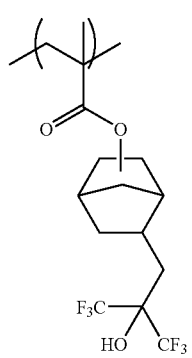
Examples of the repeat units incorporated at compositional ratio b1' in formula (R1) are shown below, though not limited thereto.
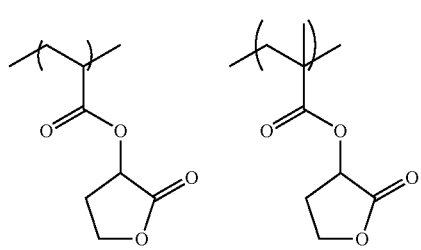
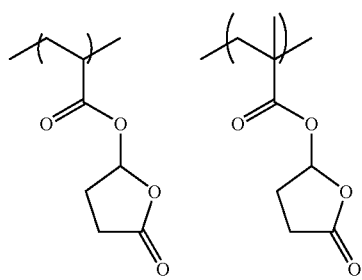
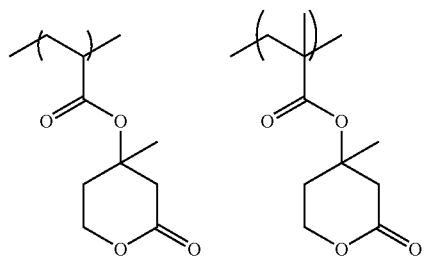
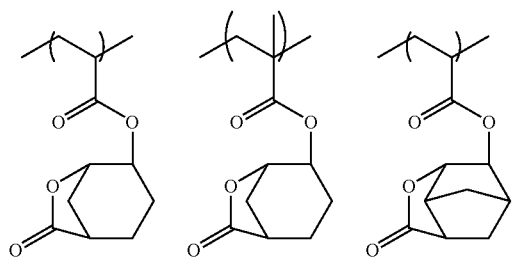

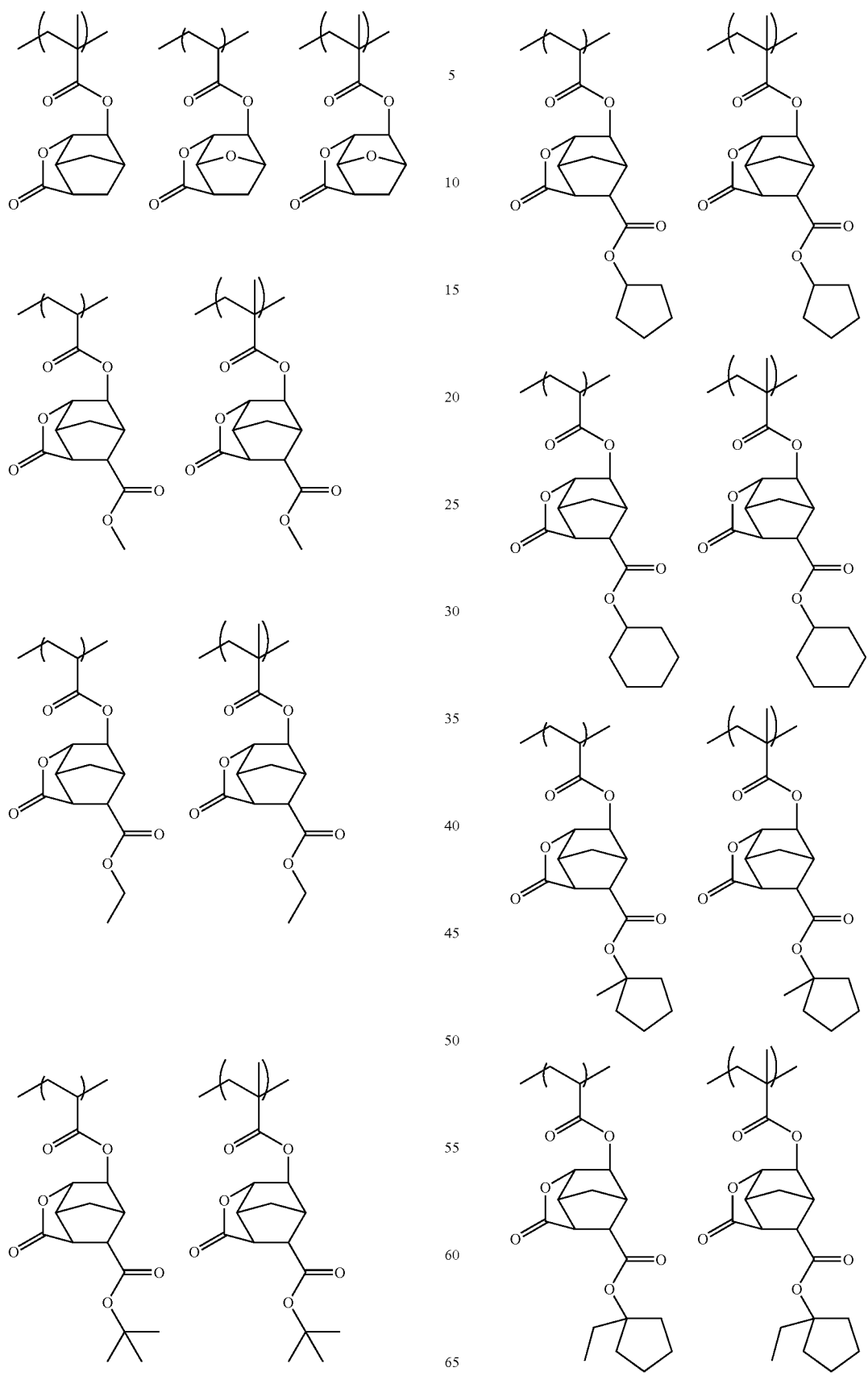

-continued
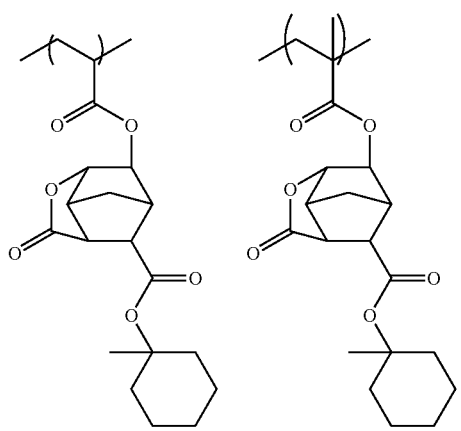
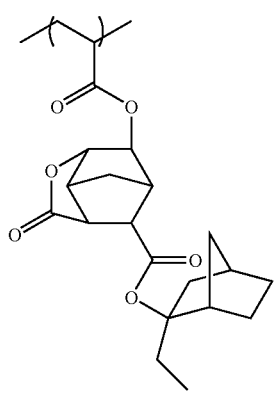
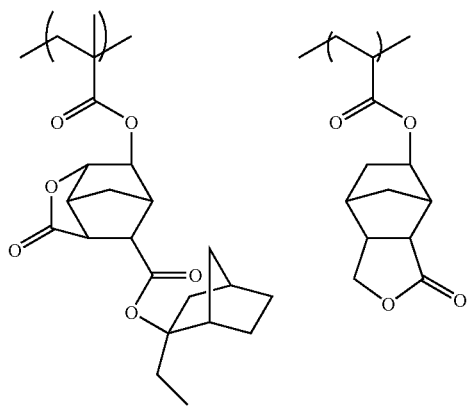
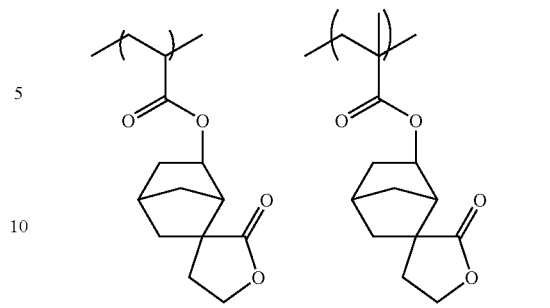
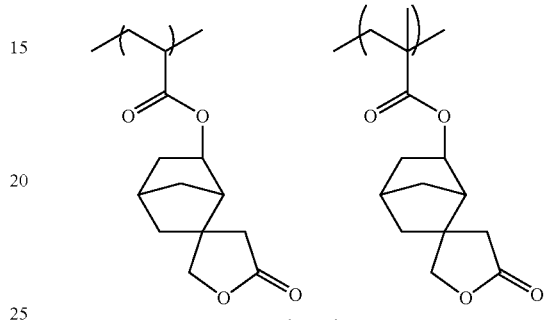
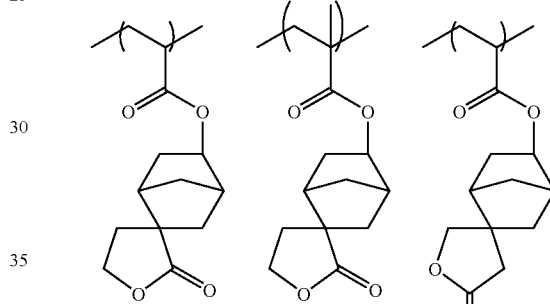
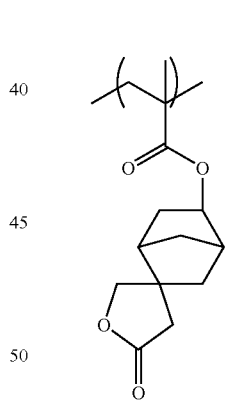
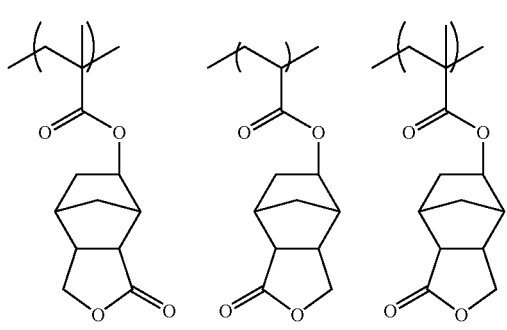
Examples of the repeat units incorporated at compositional ratio d1' in formula (R1) are shown below, though not limited thereto.
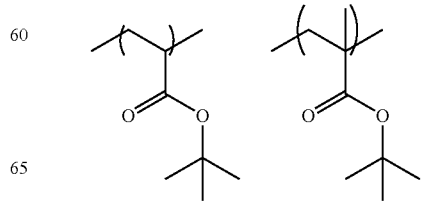

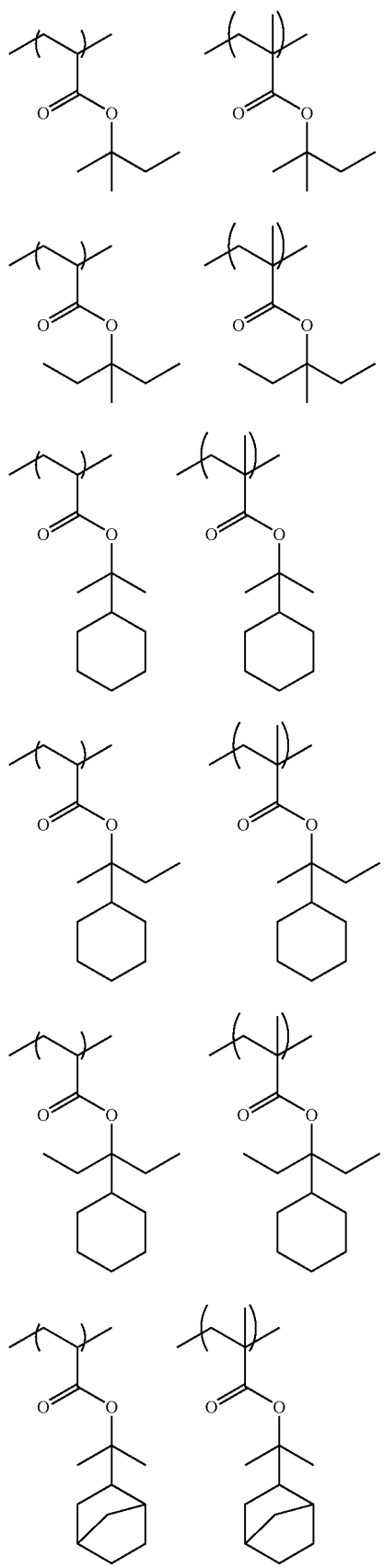
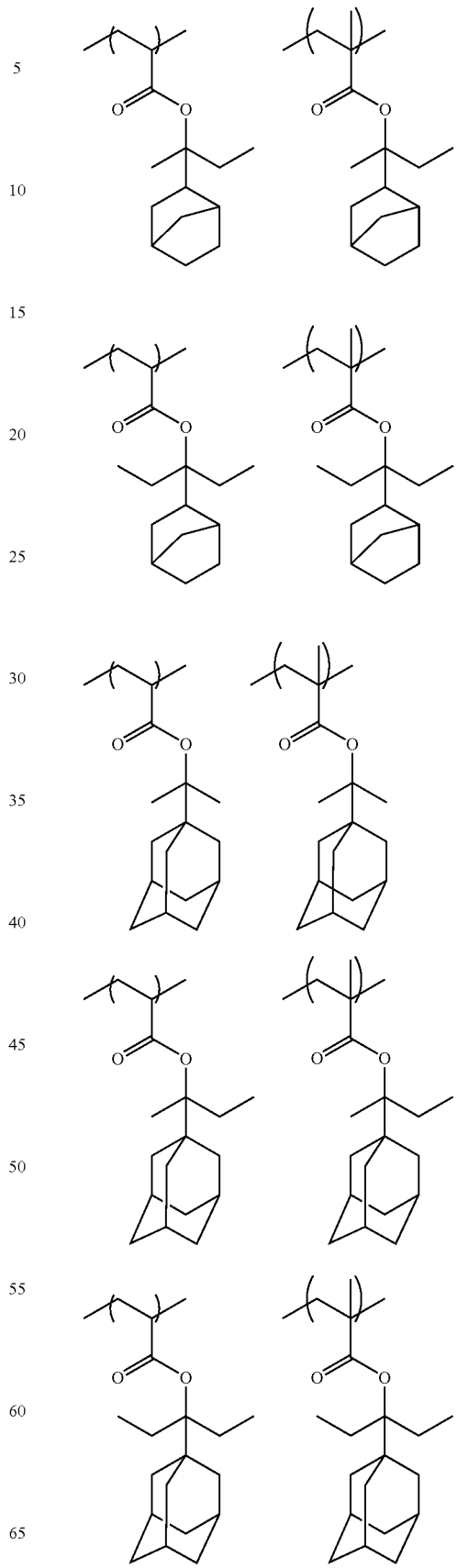

-continued
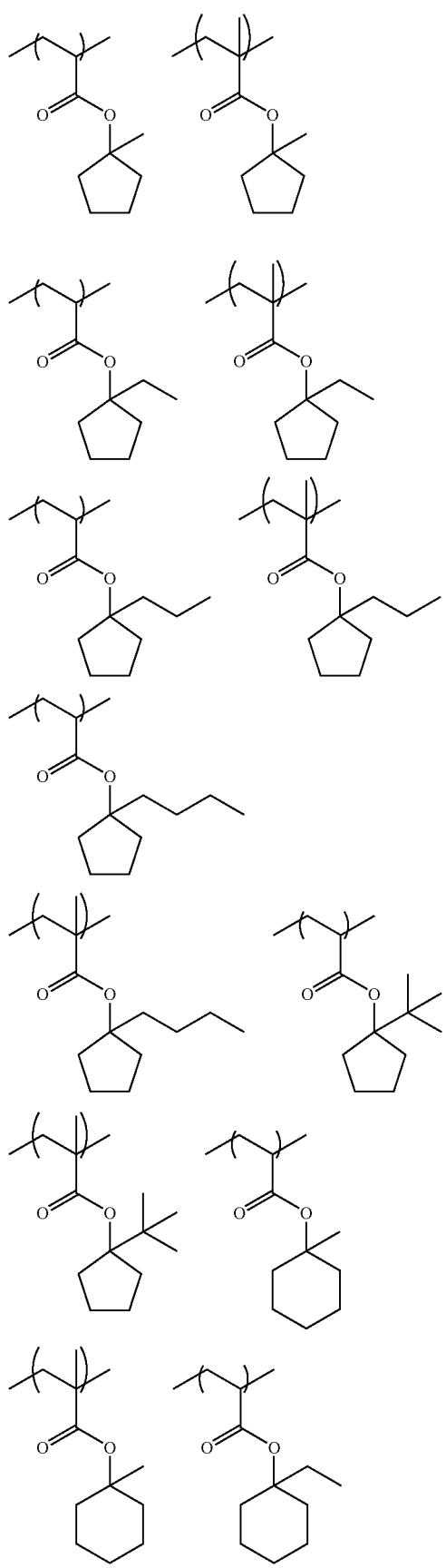
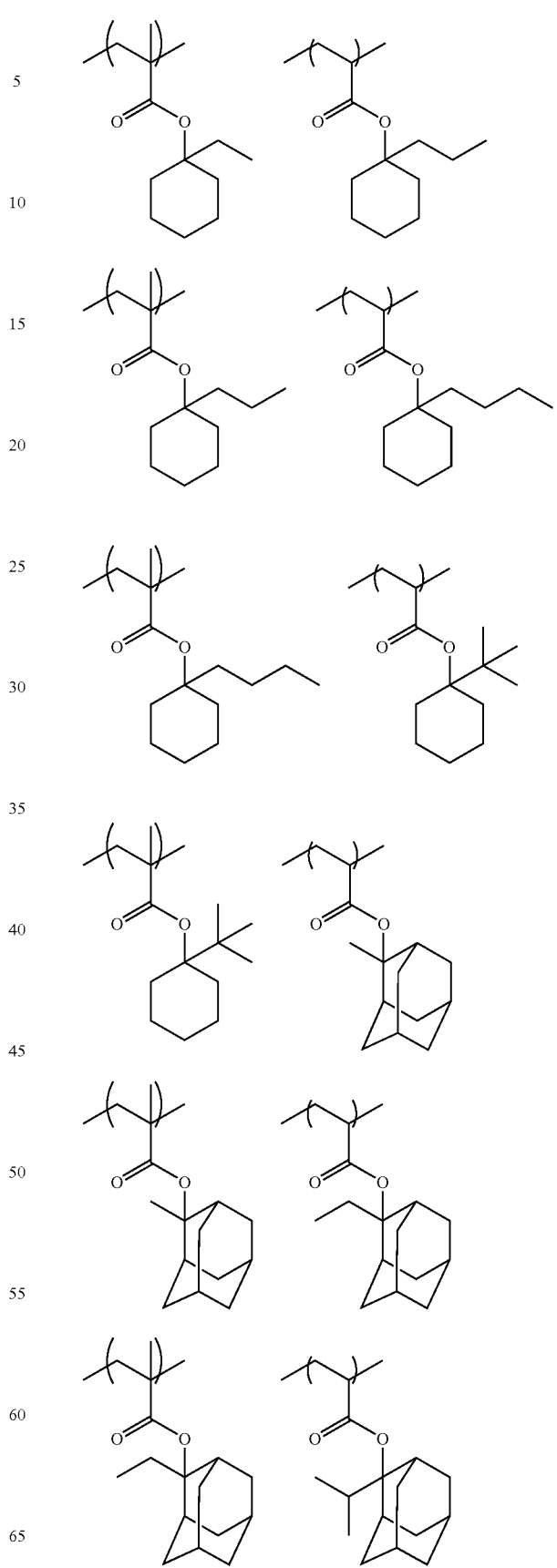

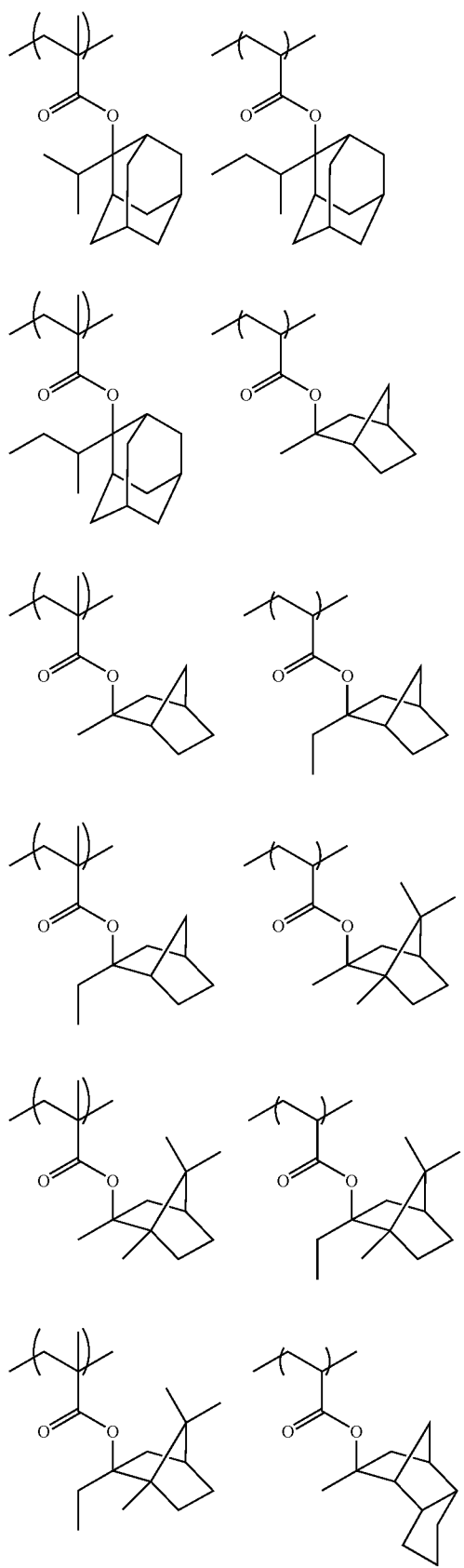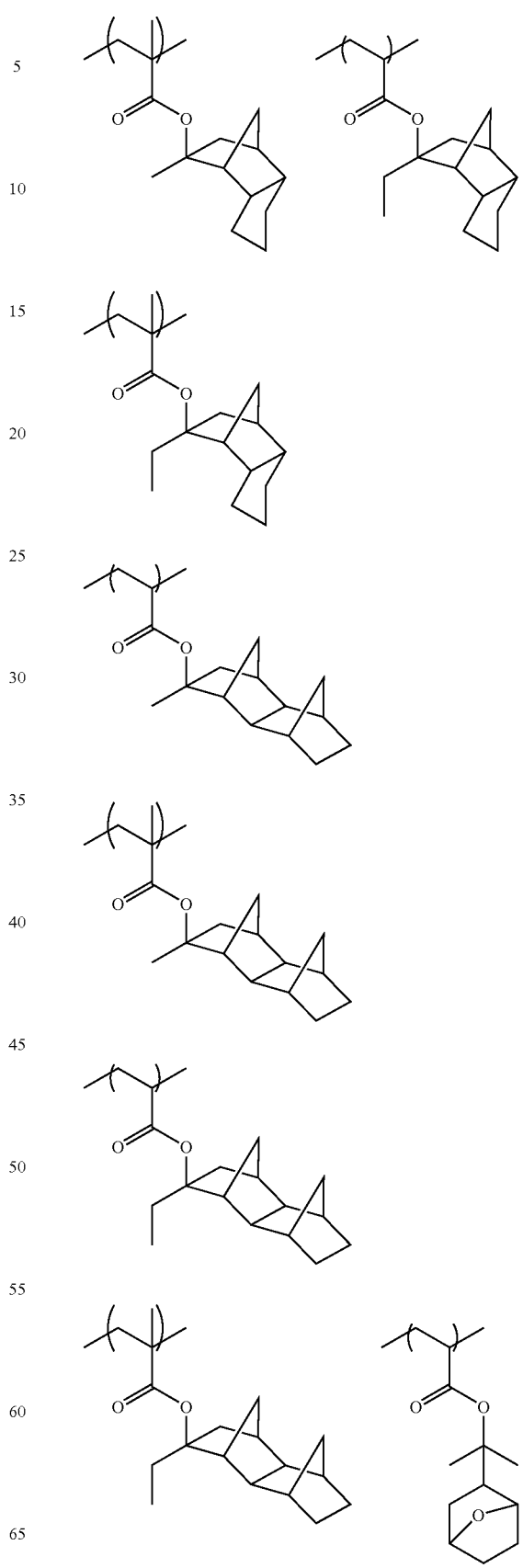

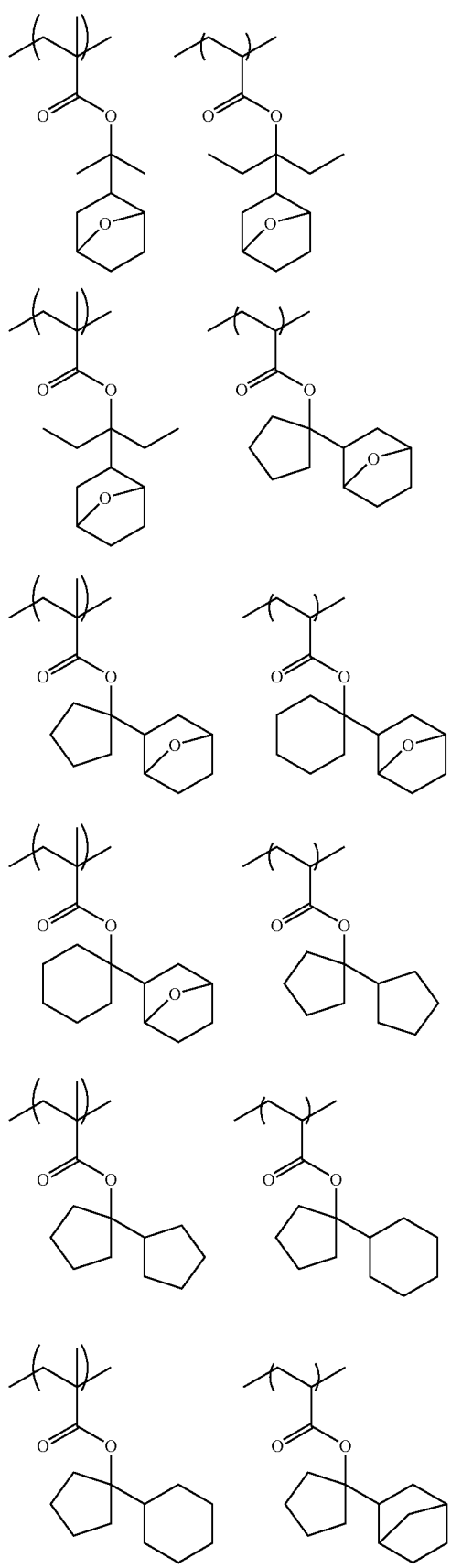
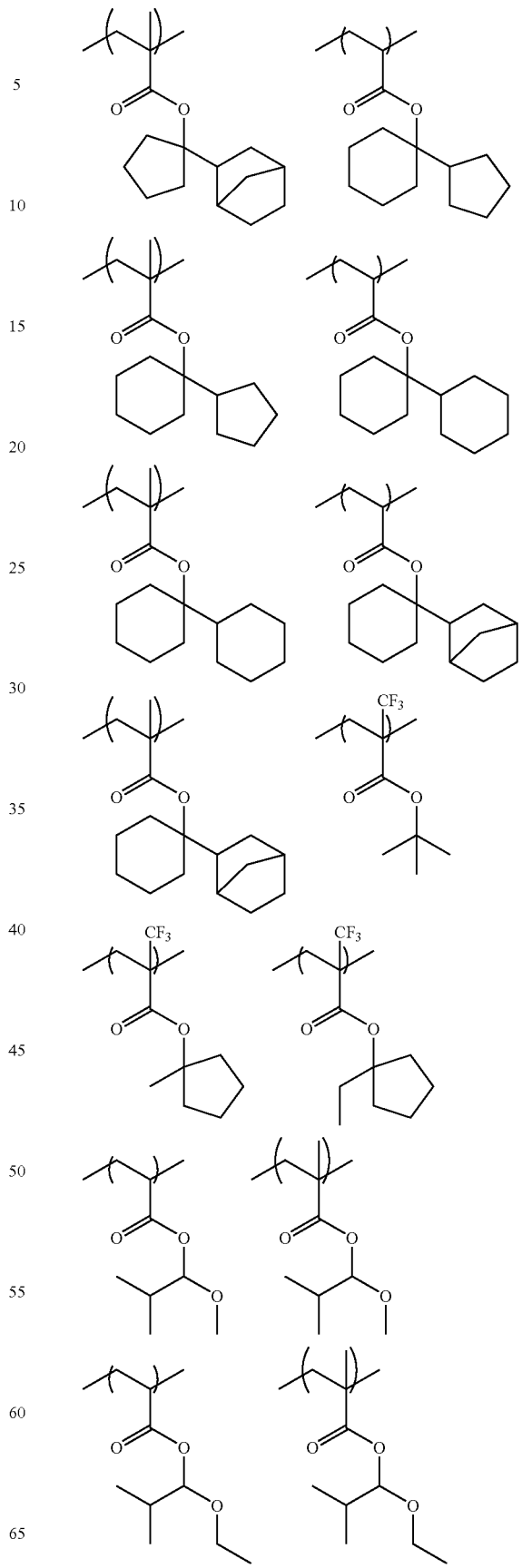

-continued
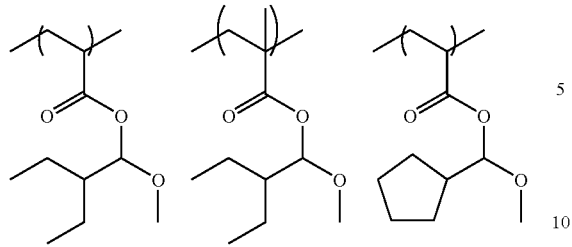
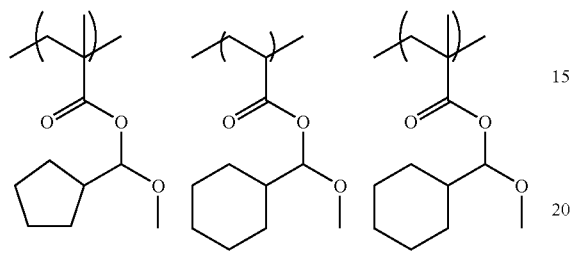
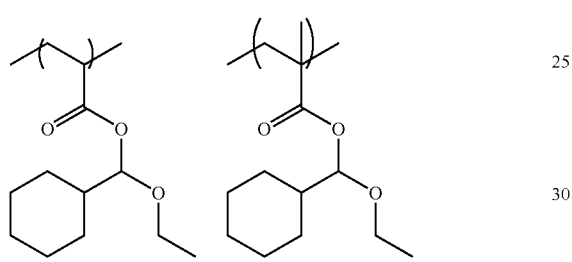
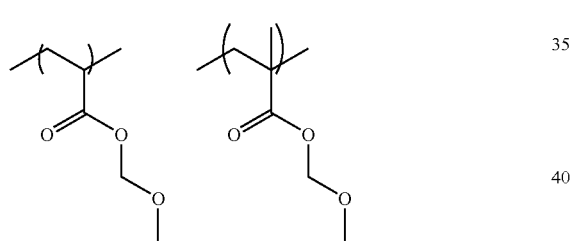
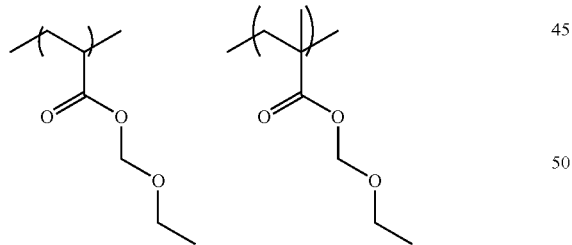
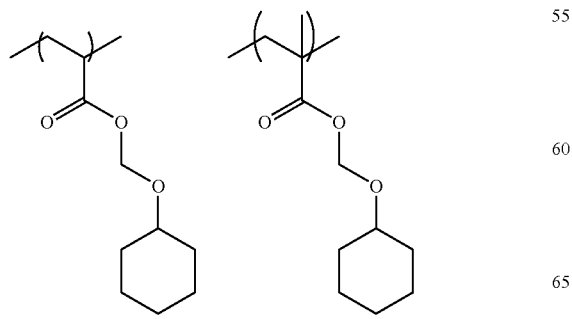
-continued
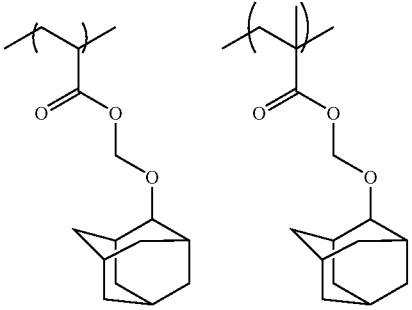
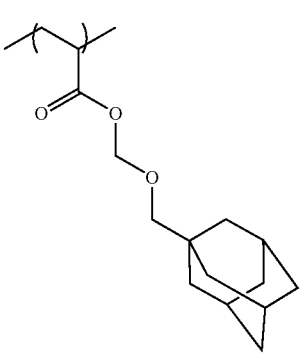
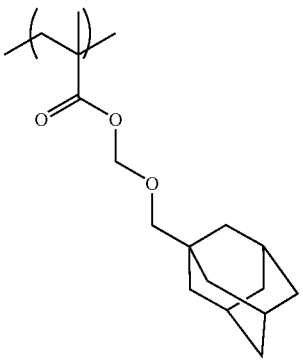
Examples of the repeat units incorporated at compositional ratio a3', b3', c3' and d3' in formula (R1) are shown below, though not limited thereto.
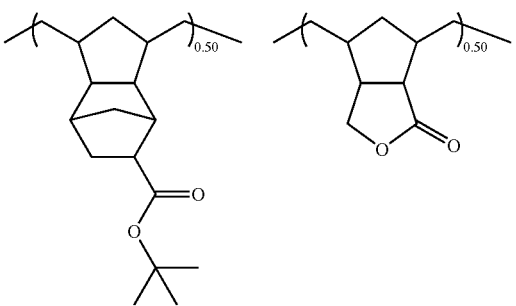

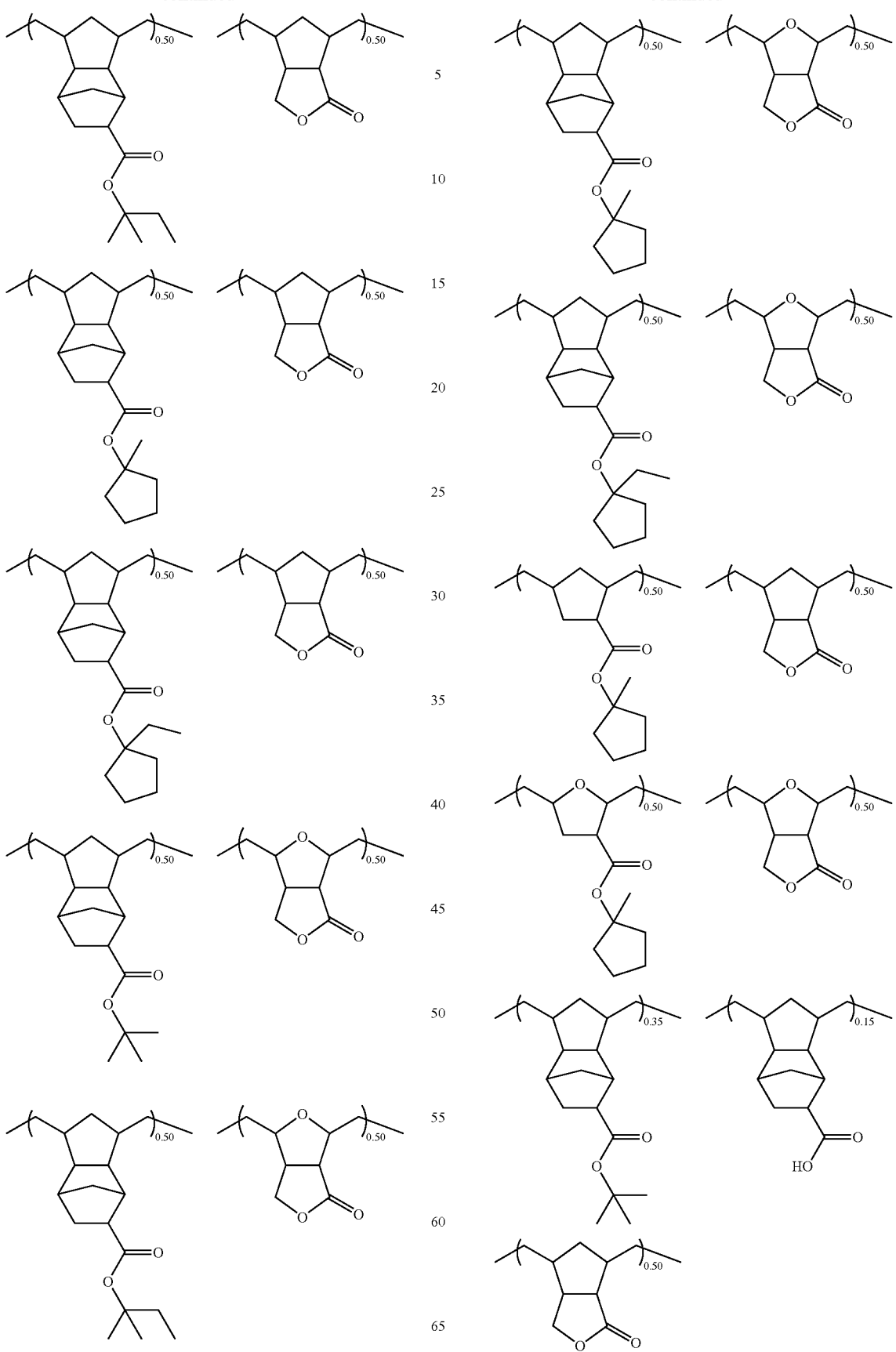

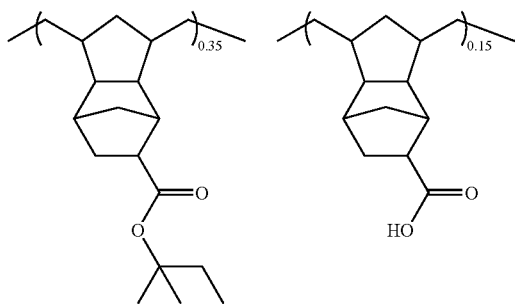
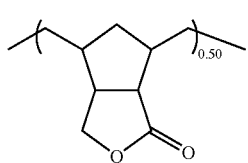
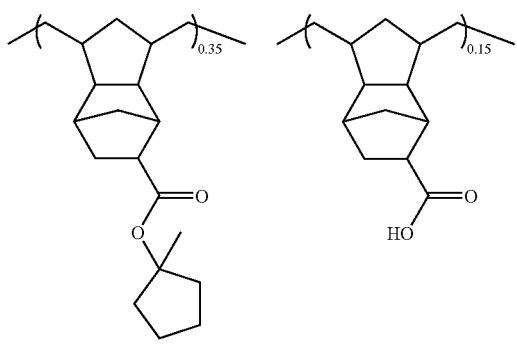
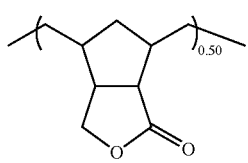
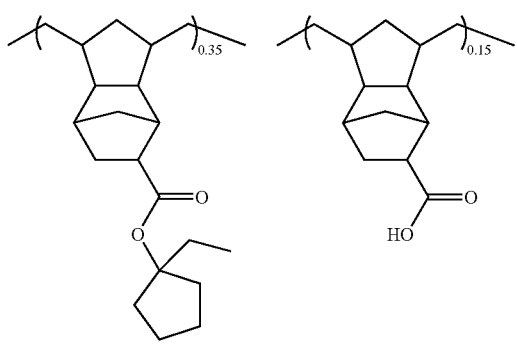
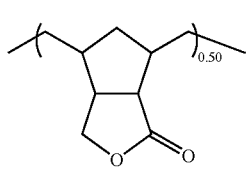
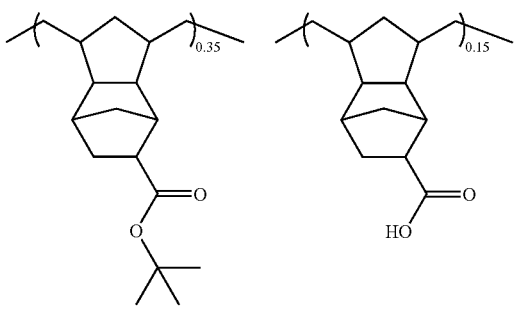
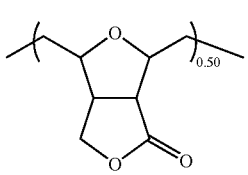
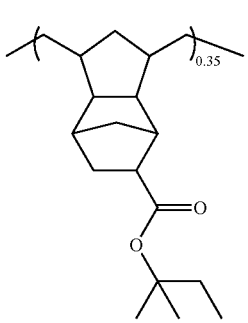
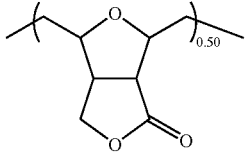
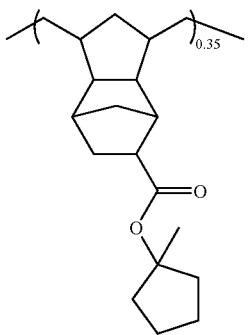
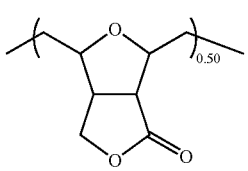

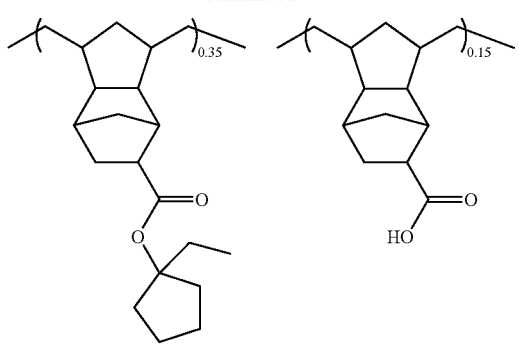
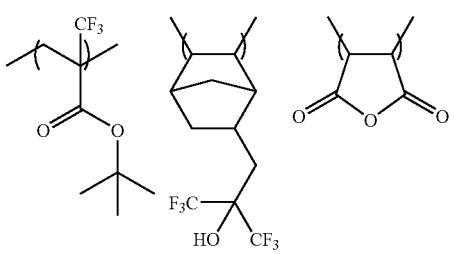
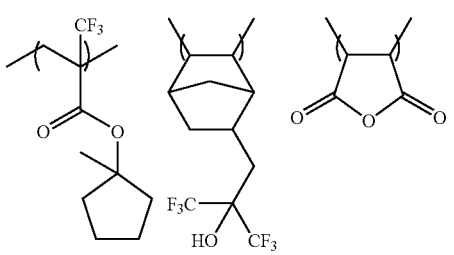
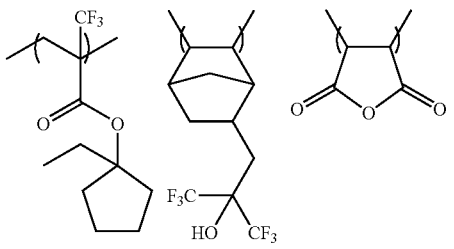
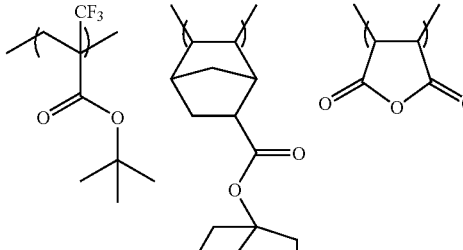
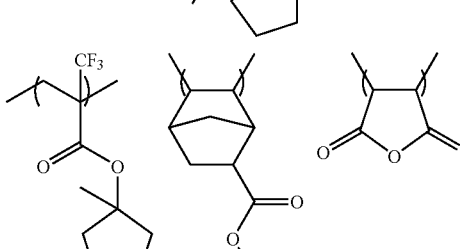
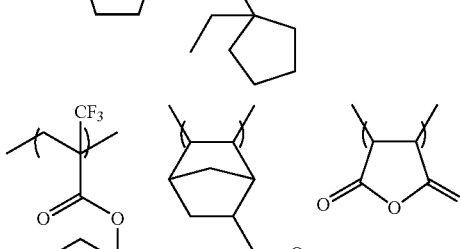
Among polymers of formula (R1), exemplary (α-trifluoromethyl)acrylate/maleic anhydride copolymers and cycloolefin/maleic anhydride copolymers are shown below, though the useful polymers are not limited thereto.

-continued

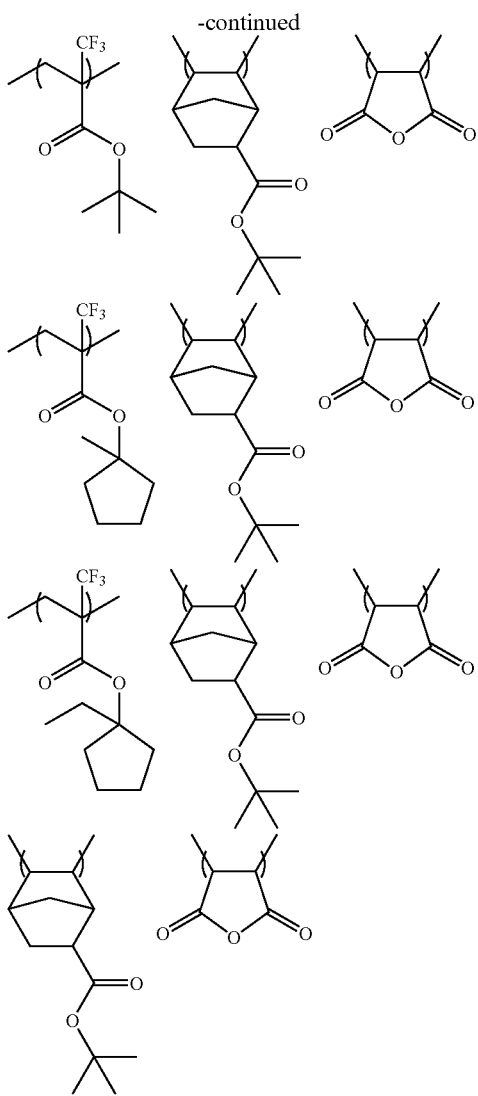

Furthermore, repeat units having a photosensitive sulfonium salt as represented by the following general formula may be copolymerized with (R1) and/or (R2) and incorporated in the polymers.

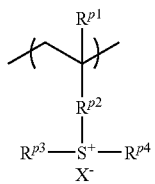

Herein $R^{p1}$ is hydrogen or methyl. $R^{p2}$ is phenylene, —O—$R^{p5}$— or —C(=O)—X—$R^{p5}$— wherein X is an oxygen atom or NH, and $R^{p5}$ is a straight, branched or cyclic $C_1$-$C_6$ alkylene, alkenylene or phenylene group which may contain a carbonyl, ester or ether group. $R^{p3}$ and $R^{p4}$ are each independently a straight, branched or cyclic $C_1$-$C_{12}$ alkyl group which may contain a carbonyl, ester or ether group, or a $C_6$-$C_{12}$ aryl group, $C_1$-$C_{20}$ aralkyl group or thiophenyl group. $X^-$ is a non-nucleophilic counter ion.

The polymer used as the base resin (B) is not limited to one type and a mixture of two or more polymers may be added. The use of plural polymers allows for easy adjustment of resist properties.

C. Acid Generator

In the resist composition of the invention, an acid generator, specifically a compound capable of generating an acid in response to high-energy radiation may be included in order that the resist composition function as a chemically amplified positive resist composition. The acid generator may be any compound capable of generating an acid upon exposure of high-energy radiation, which is generally referred to as "photoacid generator" or PAG. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more. The acid generators used herein are not limited to those exemplified below.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium.

Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropane-sulfonate, 2-acetyloxy-1,1,3,3,3-pentafluoropropane-sulfonate, 1,1,3,3,3-pentafluoro-2-hydroxypropane-sulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo

[4.4.0.1$^{2,5}$.1$^{7,10}$]dodec-3-en-8-yl)ethanesulfonate.

Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium.

Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all the hydroxyl groups are substituted by trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropane-sulfonate, 2-acetyloxy-1,1,3,3,3-pentafluoropropane-sulfonate, 1,1,3,3,3-pentafluoro-2-hydroxypropane-sulfonate, 1,1,3,3,3-pentafluoro-2-tosyloxypropanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate. Also useful are analogous nitrobenzyl sulfonate compounds in which the nitro group on the benzyl side is substituted by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives are described in Japanese Patent No. 2,906,999 and JP-A 9-301948 and include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(p-fluorobenzenesulfonyl)-nioxime, bis-O-(p-trifluoromethylbenzenesulfonyl)-nioxime, and bis-O-(xylenesulfonyl)-nioxime.

Also included are the oxime sulfonates described in U.S. Pat. No. 6,004,724, for example, (5-(4-toluenesulfonyl)oxyimino-5H-thiophen-2-ylidene)phenyl-acetonitrile, (5-(10-camphorsulfonyl)oxyimino-5H-thiophen-2-ylidene)phenyl-acetonitrile, (5-n-octanesulfonyloxyimino-5H-thiophen-2-ylidene)phenyl-acetonitrile, (5-(4-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, etc.

Also included are the oxime sulfonates described in U.S. Pat. No. 6,916,591, for example, (5-(4-(4-toluenesulfonyloxy)benzenesulfonyl)oxyimino-5H-thiophen-2-ylidene)phenylacetonitrile and (5-(2,5-bis(4-toluenesulfonyloxy)benzenesulfonyl)oxyimino-5H-thiophen-2-ylidene)phenylacetonitrile.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethyl-phenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methyl-sulfonate; 2,2,2-trifluoro-1-(2-methylphenyl)-ethanone oxime-O-(10-camphoryl)sulfonate; 2,2,2-trifluoro-1-(2,4-dimethyl-phenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethyl-phenyl)-ethanone oxime-O-(10-camphoryl)sulfonate; 2,2,2-trifluoro-1-(2,4,6-trimethylphenyl)-ethanone oxime-O-(1-naphthyl)sulfonate; 2,2,2-trifluoro-1-(2,4,6-trimethyl-phenyl)-ethanone oxime-O-(2-naphthyl)sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methyl-sulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethyl-phenyl)-ethanone oxime-O-(4-methoxyphenyl)sulfonate; 2,2,2-trifluoro-1-(4-thiomethylphenyl)-ethanone oxime-O-(4-dodecylphenyl) sulfonate; 2,2,2-trifluoro-1-(4-thiomethyl-phenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl) sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methyl-sulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propylsulfonate; 2,2,2-trifluoro-1-[4-methylsulfonylphenyl]-ethanone oxime-O-propylsulfonate; 1,3-bis[1-(4-phenoxyphenyl)-2,2,2-trifluoro-ethanone oxime-O-sulfonyl]phenyl; 2,2,2-trifluoro-1-[4-methylsulfonyloxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propyl-sulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxy-phenyl]-ethanone oxime-O-propylsulfonate; 2,2,2-trifluoro-1-[2-thiophenyl]-ethanone oxime-O-propylsulfonate; 2,2,2-trifluoro-1-[1-dioxathiophen-2-yl)]-ethanone oxime-O-propylsulfonate; 2,2,2-trifluoro-1-(4-(3-(4-(2,2,2-trifluoro-1-(trifluoromethane-sulfonyloxyimino)-ethyl)-phenoxy)-propoxy)-phenyl) ethanone oxime(trifluoromethanesulfonate); 2,2,2-trifluoro-1-(4-(3-(4-(2,2,2-trifluoro-1-(1-propane-sulfonyloxyimino)-ethyl)-phenoxy)-propoxy)-phenyl]ethanone oxime(1-propanesulfonate); and 2,2,2-trifluoro-1-(4-(3-(4-(2,2,2-trifluoro-1-(1-butanesulfonyloxyimino)-ethyl)-phenoxy)-propoxy)-phenyl]ethanone oxime(1-butanesulfonate).

Also included are the oxime sulfonates described in U.S. Pat. No. 6,916,591, for example, 2,2,2-trifluoro-1-(4-(3-(4-(2,2,2-trifluoro-1-(4-(4-methyl-phenylsulfonyloxy)phenyl-sulfonyloxyimino)-ethyl)-phenoxy)-propoxy)-phenyl)ethanone oxime(4-(4-methylphenylsulfonyloxy)-phenylsulfonate) and 2,2,2-trifluoro-1-(4-(3-(4-(2,2,2-trifluoro-1-(2,5-bis(4-methylphenylsulfonyloxy) benzenesulfonyloxy)phenylsulfonyloxy-imino)-ethyl)-phenoxy)-propoxy)-phenyl)ethanone oxime(2,5-bis(4-methylphenylsulfonyloxy)benzenesulfonyloxy)-phenylsulfonate).

Also included are the oxime sulfonates described in JP-A 9-95479 and JP-A 9-230588 and the references cited therein, for example, α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)-phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylaceto-nitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl] acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile.

Also included are oxime sulfonates having the formula:

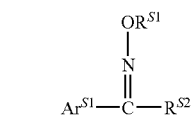

wherein $R^{s1}$ is a substituted or unsubstituted haloalkylsulfonyl or halobenzenesulfonyl group of 1 to 10 carbon atoms, $R^{s2}$ is a haloalkyl group of 1 to 11 carbon atoms, and $Ar^{s1}$ is substituted or unsubstituted aromatic or hetero-aromatic group, as described in WO 2004/074242.
Examples include 2-[2,2,3,3,4,4,5,5-octafluoro-1-(nonafluoro-butylsulfonyloxyimino)-pentyl]-fluorene, 2-[2,2,3,3,4,4-pentafluoro-1-(nonafluorobutylsulfonyloxy-imino)-butyl]-fluorene, 2-[2,2,3,3,4,4,5,5,6,6-decafluoro-1-(nonafluorobutylsulfonyl-oxyimino)-hexyl]-fluorene, 2-[2,2,3,3,4,4,5,5-octafluoro-1-(nonafluorobutylsulfonyloxy-imino)-pentyl]-4-biphenyl, 2-[2,2,3,3,4,4-pentafluoro-1-(nonafluorobutylsulfonyloxy-imino)-butyl]-4-biphenyl, and 2-[2,2,3,3,4,4,5,5,6,6-decafluoro-1-(nonafluorobutylsulfonyl-oxyimino)-hexyl]-4-biphenyl.

Suitable bisoxime sulfonates include those described in JP-A 9-208554, for example, bis(α-(4-toluenesulfonyloxy) imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis (α-(10-camphorsulfonyloxy)imino)-p-phenylenediacetonitrile, bis(α-(4-toluenesulfonyloxy)imino)-p-phenylenediacetonitrile, bis(α-(trifluoromethanesulfonyloxy)imino)-p-phenylenediaceto-nitrile, bis(α-(4-methoxybenzenesulfonyloxy)imino)-p-phenylenediaceto-nitrile, bis(α-(4-toluenesulfonyloxy) imino)-m-phenylenediacetonitrile, bis(α-(benzenesulfonyloxy)imino)-m-phenylenediacetonitrile, bis (α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediaceto-nitrile, bis(α-(4-toluenesulfonyloxy)imino)-m-phenylenediacetonitrile, bis(α-(trifluoromethanesulfonyloxy) imino)-m-phenylenediaceto-nitrile, bis(α-(4-methoxybenzenesulfonyloxy)imino)-m-phenylenediaceto-nitrile, etc.

Of these, preferred photoacid generators are sulfonium salts, bissulfonyldiazomethanes, N-sulfonyloxyimides, oxime-O-sulfonates and glyoxime derivatives. More preferred photoacid generators are sulfonium salts, bissulfonyldiazomethanes, N-sulfonyloxyimides, and oxime-O-sulfonates. Typical examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyl-oxy)benzenesulfonate, tris(4-methylphenyl)sulfonium camphorsulfonate, tris(4-tert-butylphenyl)sulfonium camphorsulfonate, 4-tert-butylphenyldiphenylsulfonium camphorsulfonate, 4-tert-butylphenyldiphenylsulfonium nonafluoro-1-butane-sulfonate, 4-tert-butylphenyldiphenylsulfonium pentafluoroethylperfluorocyclohexanesulfonate, 4-tert-butylphenyldiphenylsulfonium perfluoro-1-octane-sulfonate, triphenylsulfonium 1,1-difluoro-2-naphthylethanesulfonate, triphenylsulfonium 1,1,2,2-tetrafluoro-2-(norbornan-2-yl)-ethanesulfonate, bis(tert-butylsulfonyl)diazomethane, bis(cyclohexylsulfonyl)diazomethane, bis(2,4-dimethylphenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, bis(4-tert-butylphenylsulfonyl)diazomethane, N-camphorsulfonyloxy-5-norbornene-2,3-dicarboxylic acid imide, N-p-toluenesulfonyloxy-5-norbornene-2,3-dicarboxylic acid imide, 2-[2,2,3,3,4,4,5,5-octafluoro-1-(nonafluorobutylsulfonyloxy-imino)-pentyl]-fluorene, 2-[2,2,3,3,4,4-pentafluoro-1-(nonafluorobutylsulfonyloxy-imino)-butyl]-fluorene, and 2-[2,2,3,3,4,4,5,5,6,6-decafluoro-1-(nonafluorobutylsulfonyl-oxyimino)-hexyl]-fluorene.

In the chemically amplified positive resist composition, an appropriate amount of the photoacid generator is, but not limited to, 0.1 to 20 parts, and especially 0.1 to 10 parts by weight per 100 parts by weight of the base resin (B). If the amount of the PAG is up to 20 phr, the resulting photoresist film has a sufficiently high transmittance to minimize a risk of degrading resolution. The PAG may be used alone or in admixture of two or more. The transmittance of the resist film can be controlled by using a PAG having a low transmittance at the exposure wavelength and adjusting the amount of the PAG added.

In the resist composition, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid-amplifier compound is up to 2 parts, and preferably up to 1 part by weight per 100 parts by weight of the base resin (B). Up to 2 phr of the acid-amplifier compound allows for diffusion control, minimizing a risk of degrading resolution and pattern profile.

In addition to (A) additive polymer, (B) base resin or polymer and (C) photoacid generator, the resist composition of the invention may further comprise (D) an organic solvent, (E) a basic compound, and (F) a dissolution inhibitor.

D. Solvent

The organic solvent used herein may be any organic solvent in which the additive polymer, base resin, acid generator, and other components are soluble. Illustrative, non-limiting, examples of the organic solvent include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, PGMEA, and mixtures thereof because the acid generator is most soluble therein.

An appropriate amount of the organic solvent used is 200 to 3,000 parts, especially 400 to 2,500 parts by weight per 100 parts by weight of the base resin (B).

E. Basic Compound

In the resist composition, an organic nitrogen-containing compound or compounds may be compounded as the basic compound. The organic nitrogen-containing compound used herein is preferably a compound capable of suppressing the rate of diffusion when the acid generated by the acid generator diffuses within the resist film. The inclusion of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

Suitable organic nitrogen-containing compounds include, but are not limited to, primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl or hydroxyphenyl group include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, organic nitrogen-containing compounds of the following general formula (B)-1 may also be included alone or in admixture.

$$N(X)_n(Y)_{3-n} \quad (B)\text{-}1$$

In the formula, n is equal to 1, 2 or 3; side chain Y is independently hydrogen or a straight, branched or cyclic $C_1$-$C_{20}$ alkyl group which may contain an ether or hydroxyl group; and side chain X is independently selected from groups of the following general formulas (X1) to (X3), and two or three X's may bond together to form a ring.

$$-[R^{300}-O-R^{301}] \quad (X1)$$

$$-[R^{302}-O-R^{303}-\overset{O}{\underset{\|}{C}}-R^{304}] \quad (X2)$$

$$-[R^{305}-\overset{O}{\underset{\|}{C}}-O-R^{306}] \quad (X3)$$

In the formulas, $R^{300}$, $R^{302}$ and $R^{305}$ are independently straight or branched $C_1$-$C_4$ alkylene groups; $R^{301}$ and $R^{304}$ are independently hydrogen or a straight, branched or cyclic $C_1$-$C_{20}$ alkyl group which may contain one or more hydroxyl, ether, ester groups or lactone rings; $R^{303}$ is a single bond or a straight or branched $C_1$-$C_4$ alkylene group; and $R^{306}$ is a straight, branched or cyclic $C_1$-$C_{20}$ alkyl group which may contain one or more hydroxyl, ether, ester groups or lactone rings.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2- methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more organic nitrogen-containing compounds having cyclic structure represented by the following general formula (B)-2.

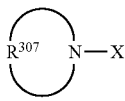
(B)-2

Herein X is as defined above, and $R^{307}$ is a straight or branched $C_2$-$C_{20}$ alkylene group which may contain one or more carbonyl, ether, ester or sulfide groups.

Illustrative examples of the organic nitrogen-containing compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, and 2-morpholinoethyl stearate.

Also, one or more organic nitrogen-containing compounds having cyano group represented by the following general formulae (B)-3 to (B)-6 may be blended.

(B)-3

(B)-4

(B)-5

(B)-6

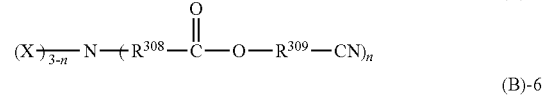

Herein, X, $R^{307}$ and n are as defined above, and $R^{308}$ and $R^{309}$ are each independently a straight or branched $C_1$-$C_4$ alkylene group.

Illustrative examples of the organic nitrogen-containing compounds having cyano represented by formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiono-nitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiono-nitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-amino-propionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are organic nitrogen-containing compounds of imidazole structure having a polar functional group, represented by the general formula (B)-7.

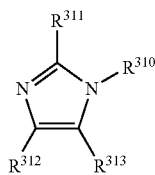

(B)-7

Herein, $R^{310}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{311}$, $R^{312}$ and $R^{313}$ are each independently hydrogen, a straight, branched or cyclic alkyl group, aryl group or aralkyl group having 1 to 10 carbon atoms.

Also included are organic nitrogen-containing compounds of benzimidazole structure having a polar functional group, represented by the general formula (B)-8.

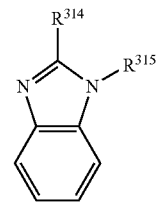

(B)-8

Herein, $R^{314}$ is hydrogen, a straight, branched or cyclic alkyl group, aryl group or aralkyl group having 1 to 10 carbon atoms. $R^{315}$ is a polar functional group-bearing, straight, branched or cyclic $C_1$-$C_{20}$ alkyl group, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

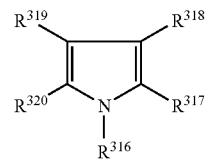

(B)-9

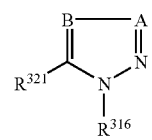

(B)-10

Herein, A is a nitrogen atom or $=C-R^{322}$, B is a nitrogen atom or $=C-R^{323}$, $R^{316}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently hydrogen, a straight, branched or cyclic alkyl group or aryl group having 1 to 10 carbon atoms, or a pair of $R^{317}$ and $R^{318}$ and a pair of $R^{319}$ and $R^{320}$, taken together, may form a benzene, naphthalene or pyridine ring with the carbon atoms to which they are attached; $R^{321}$ is hydrogen, a straight, branched or cyclic alkyl group or aryl group having 1 to 10 carbon atoms; $R^{322}$ and $R^{323}$ each are hydrogen, a straight, branched or cyclic alkyl group or aryl group having 1 to 10 carbon atoms, or a pair of $R^{321}$ and $R^{323}$, taken together, may form a benzene or naphthalene ring with the carbon atoms to which they are attached.

Also included are organic nitrogen-containing compounds of aromatic carboxylic ester structure having the general formulae (B)-11 to (B)-14.

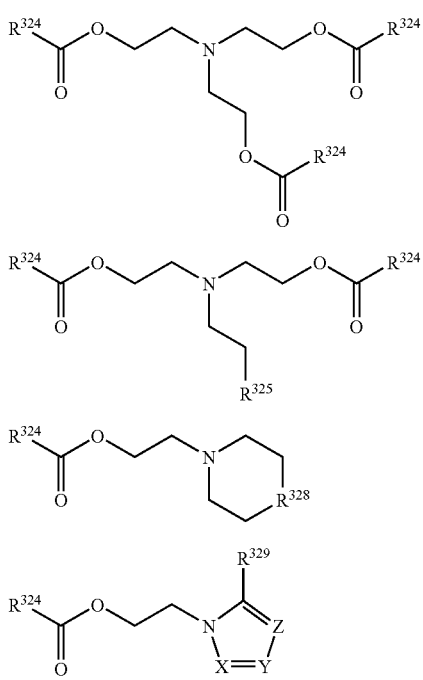

(B)-11

(B)-12

(B)-13

(B)-14

Herein $R^{324}$ is a $C_6$-$C_{20}$ aryl group or $C_4$-$C_{20}$ hetero-aromatic group, in which some or all hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —O(CH$_2$CH$_2$O)$_n$— group wherein n is 0, 1, 2, 3 or 4. $R^{329}$ is hydrogen, methyl, ethyl or phenyl. X is a nitrogen atom or $CR^{330}$. Y is a nitrogen atom or $CR^{331}$. Z is a nitrogen atom or $CR^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring with the carbon atoms to which they are attached.

Further included are organic nitrogen-containing compounds of 7-oxanorbornane-2-carboxylic ester structure having the general formula (B)-15.

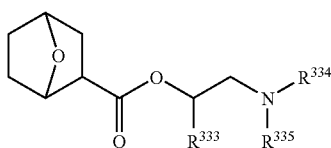

(B)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_1$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a heterocyclic or hetero-aromatic ring of 2 to 20 carbon atoms with the nitrogen atom to which they are attached.

The organic nitrogen-containing compounds may be used alone or in admixture of two or more. The organic nitrogen-containing compound is preferably formulated in an amount of 0.001 to 2 parts, and especially 0.01 to 1 part by weight, per 100 parts by weight of the base resin (B). At least 0.001 phr of the nitrogen-containing compound achieves a desired addition effect whereas up to 2 phr minimizes a risk of lowering sensitivity.

F. Dissolution Inhibitor

The dissolution inhibitor which can be added to the resist composition is a compound having on the molecule at least two phenolic hydroxyl groups, in which an average of from 0 to 100 mol % of all the hydrogen atoms on the phenolic hydroxyl groups are replaced by acid labile groups or a compound having on the molecule at least one carboxyl group, in which an average of 50 to 100 mol % of all the hydrogen atoms on the carboxyl groups are replaced by acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having a carboxyl group include those of formulas (D1) to (D14) below.

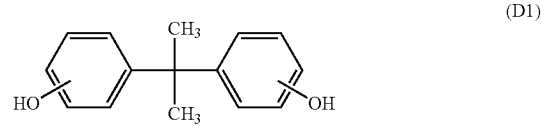

(D1)

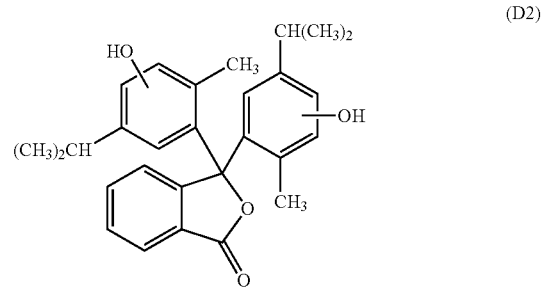

(D2)

(D3)

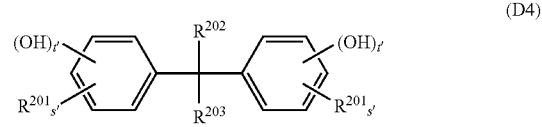

(D4)

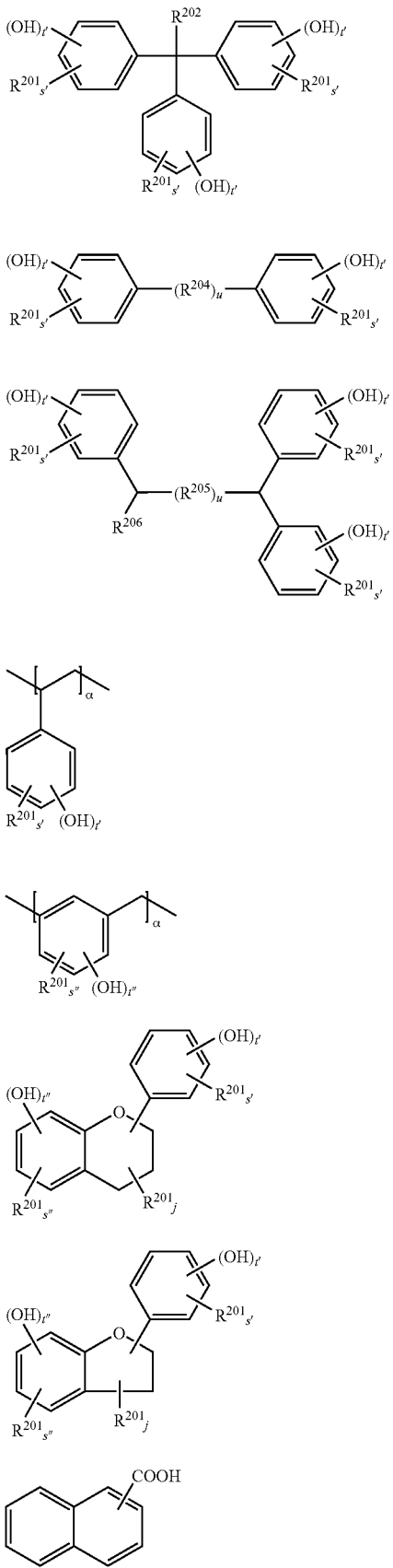
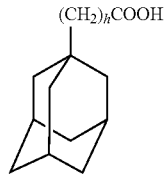

In these formulas, $R^{201}$ and $R^{202}$ are each hydrogen or a straight or branched $C_1$-$C_8$ alkyl or alkenyl group; $R^{203}$ is hydrogen, a straight or branched $C_1$-$C_8$ alkyl or alkenyl group, or —$(R^{207})_h$—COOH; $R^{204}$ is —$(CH_2)_i$—, $C_6$-$C_{10}$ arylene, carbonyl, sulfonyl, an oxygen atom, or a sulfur atom; $R^{205}$ is a $C_1$-$C_{10}$ alkylene, a $C_6$-$C_{10}$ arylene, carbonyl, sulfonyl, an oxygen atom, or a sulfur atom; $R^{206}$ is hydrogen, a straight or branched $C_1$-$C_8$ alkyl or alkenyl, or a phenyl or naphthyl group in which at least one hydrogen atom is substituted by a hydroxyl group; $R^{207}$ is a straight or branched $C_1$-$C_{10}$ alkylene; $R^{208}$ is hydrogen or hydroxyl; h is 0 or 1, i is an integer of 2 to 10, j is an integer of 0 to 5, u is 0 or 1; s, t, s', t', s", and t" are each numbers which satisfy s+t=8, s'+t'=5, and s"+t"=4, and are such that each phenyl structure has at least one hydroxyl group; and α is a number such that the compounds of formula (D8) or (D9) have a weight average molecular weight of from 100 to 1,000.

Exemplary acid labile groups on the dissolution inhibitor include a variety of such groups, typically groups of the general formulae (L1) to (L4), tertiary $C_4$-$C_{20}$ alkyl groups, trialkylsilyl groups in which each of the alkyls has 1 to 6 carbon atoms, and $C_4$-$C_{20}$ oxoalkyl groups. Examples of the respective groups are as previously described.

The dissolution inhibitor may be formulated in an amount of 0 to 50 parts, preferably 0 to 40 parts, and more preferably 0 to 30 parts by weight, per 100 parts by weight of the base resin (B), and may be used singly or as a mixture of two or more thereof. Up to 50 parts of the dissolution inhibitor may minimize a risk of slimming the patterned film to invite a decline in resolution.

The dissolution inhibitor can be synthesized by introducing acid labile groups into a compound having phenolic hydroxyl or carboxyl groups in accordance with an organic chemical formulation.

If desired, the resist composition of the invention may further comprise a carboxylic acid compound, acetylene alcohol derivative or other optional ingredients. Optional ingredients may be added in conventional amounts so long as this does not compromise the objects of the invention.

The carboxylic acid compound used herein may be one or more compounds selected from Groups I and II below, but is not limited thereto. Including this compound improves the post-exposure delay (PED) stability of the resist and ameliorates edge roughness on nitride film substrates.

Group I:
Compounds of general formulas (A1) to (A10) below in which some or all of the hydrogen atoms on the phenolic hydroxyl groups are replaced by —R$^{401}$—COOH (wherein R$^{401}$ is a straight or branched C$_1$-C$_{10}$ alkylene group), and in which the molar ratio C/(C+D) of phenolic hydroxyl groups (C) to ≡C—COOH groups (D) in the molecule is from 0.1 to 1.0.

Group II:

Compounds of general formulas (A11) to (A15) below.

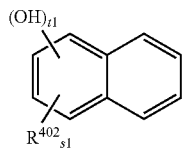
(A1)

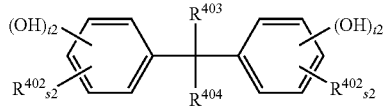
(A2)

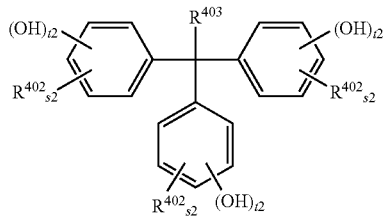
(A3)

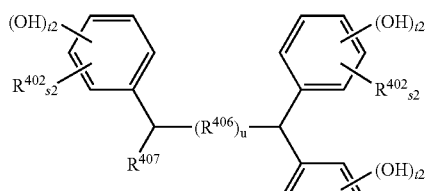
(A4)

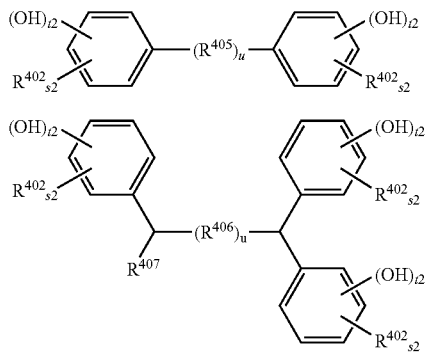
(A5)

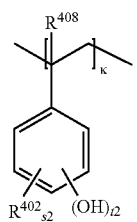
(A6)

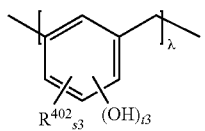
(A7)

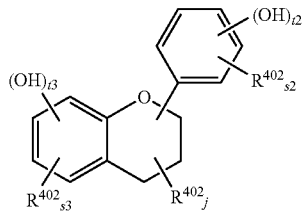
(A8)

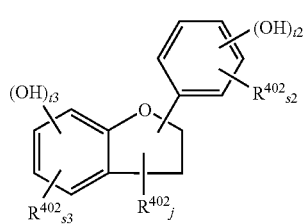
(A9)

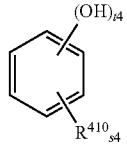
(A10)

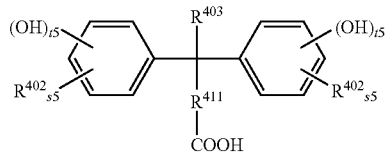
(A11)

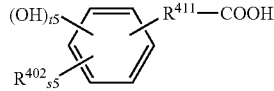
(A12)

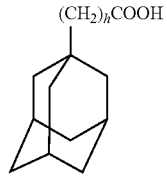
(A13)

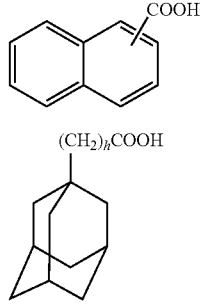
(A14)

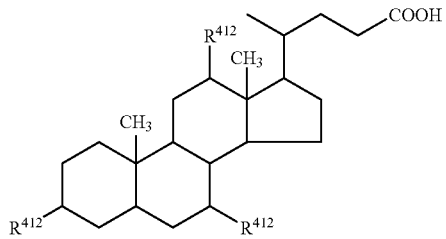
(A15)

In these formulas, R$^{402}$ and R$^{403}$ are each hydrogen or a straight or branched C$_1$-C$_8$ alkyl or alkenyl. R$^{404}$ is hydrogen, a straight or branched C$_1$-C$_8$ alkyl or alkenyl, or a —(R$^{409}$)$_h$—COOR' group wherein R' is hydrogen or —R$^{409}$—COOH. R$^{405}$ is —(CH$_2$)$_i$— (wherein i is 2 to 10), a C$_6$-C$_{10}$ arylene, carbonyl, sulfonyl, an oxygen atom, or a sulfur atom. R$^{406}$ is a C$_1$-C$_{10}$ alkylene, a C$_6$-C$_{10}$ arylene, carbonyl, sulfonyl, an oxygen atom, or a sulfur atom. R$^{407}$ is hydrogen, a straight or branched C$_1$-C$_8$ alkyl or alkenyl, or a hydroxyl-substituted phenyl or naphthyl. R$^{408}$ is hydrogen or methyl. R$^{409}$ is a straight or branched C$_1$-C$_{10}$ alkylene. R$^{410}$ is hydrogen, a straight or branched C$_1$-C$_8$ alkyl or alkenyl, or a —R$^{411}$—COOH group wherein R$^{411}$ is a straight or branched C$_1$-C$_{10}$ alkylene. R$^{412}$ is hydrogen or hydroxyl. The letter j is a number from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; s5 and t5 are numbers which satisfy s5≧0, t5≧0, and s5+t5=5; u is a number from 1 to 4; h is a number from 1 to 4; κ is a number such that the compound of formula (A6) may have a weight average molecular weight of 1,000 to 5,000; and λ is a number such that the compound of formula (A7) may have a weight average molecular weight of 1,000 to 10,000.

Illustrative, non-limiting examples of the compound having a carboxyl group include compounds of the general formulas AI-1 to AI-14 and AII-1 to AII-10 below.

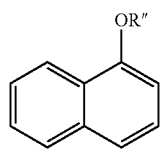
(AI-1)

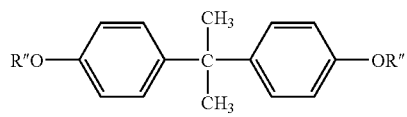
(AI-2)

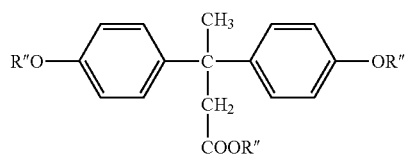
(AI-3)

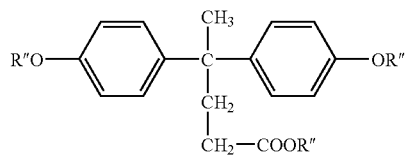
(AI-4)

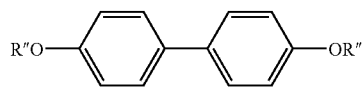
(AI-5)

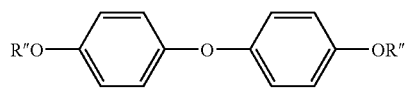
(AI-6)

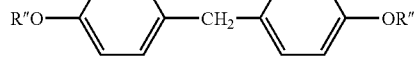
(AI-7)

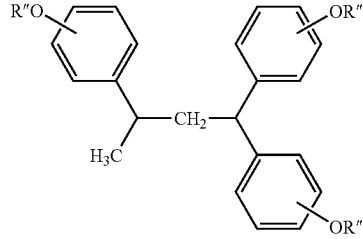
(AI-8)

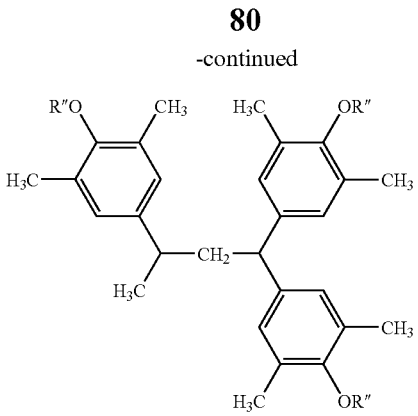
(AI-9)

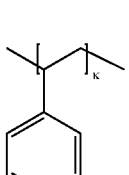
(AI-10)

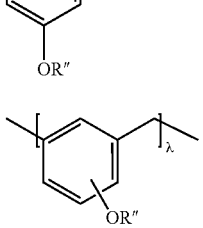
(AI-11)

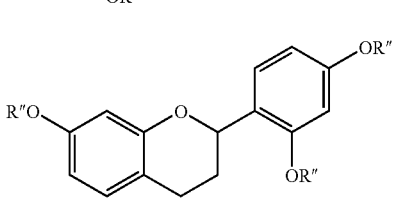
(AI-12)

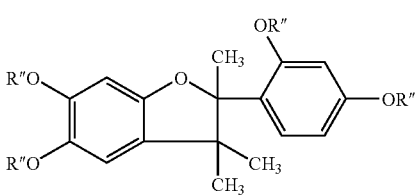
(AI-13)

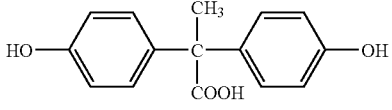
(AI-14)

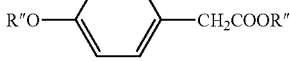

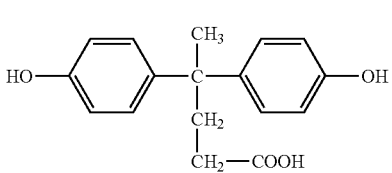
(AII-1)

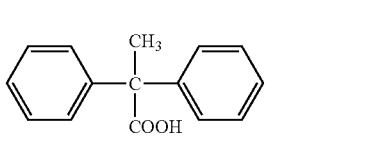
(AII-2)

(AII-3)

(AII-4)
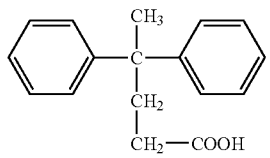

(AII-5)
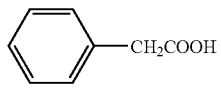

(AII-6)
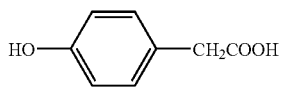

(AII-7)
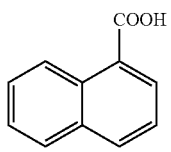

(AII-8)
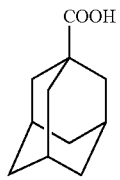

(AII-9)
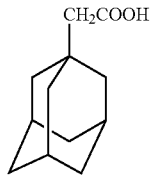

(AII-10)
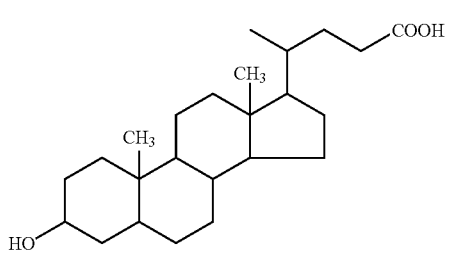

In the above formulas, R'' is hydrogen or a —CH$_2$COOH group such that the —CH$_2$COOH group accounts for 10 to 100 mol % of R'' in each compound, κ and λ are as defined above.

The compound having a ≡C—COOH group may be used singly or as combinations of two or more thereof. The compound having a ≡C—COOH group is added in an amount ranging from 0 to 5 parts, preferably 0.1 to 5 parts, more preferably 0.1 to 3 parts, and further preferably 0.1 to 2 parts by weight, per 100 parts by weight of the base polymer (B). Up to 5 phr of the compound may have a minimal risk of reducing the resolution of the resist composition.

Preferred examples of the acetylene alcohol derivative which can be added to the resist composition include those having the general formula (S1) or (S2) below.

(S1)
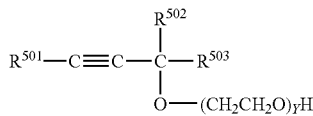

(S2)
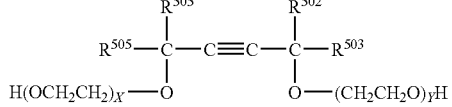

In the formulas, R$^{501}$, R$^{502}$, R$^{503}$, R$^{504}$, and R$^{505}$ are each hydrogen or a straight, branched or cyclic C$_1$-C$_8$ alkyl; and X and Y are each 0 or a positive number, satisfying 0≦X≦30, 0≦Y≦30, and 0≦X+Y≦40.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industries Ltd.

The acetylene alcohol derivative is preferably added in an amount of 0.01 to 2%, and more preferably 0.02 to 1% by weight based on the resist composition. At least 0.01 wt % of the acetylene alcohol derivative is effective for improving the coating characteristics and shelf stability whereas up to 2 wt % may have little impact on the resolution of the resist composition.

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from DIC Corp., and X-70-092 and X-70-093 from Shin-Etsu Chemical Co., Ltd. Preferred surfactants are Fluorad FC-430 from Sumitomo 3M, Ltd., KH-20 and KH-30 from Asahi Glass Co., Ltd., and X-70-093 from Shin-Etsu Chemical Co., Ltd.

Process

It is now described how to form a pattern using the resist composition of the invention. A pattern may be formed from the resist composition of the invention using any well-known lithography process. The preferred method includes at least the steps of forming a photoresist coating on a substrate, exposing it to high-energy radiation, and developing it with a developer.

For example, the resist composition is applied onto a substrate, typically a silicon wafer by a suitable coating technique such as spin coating. The coating is prebaked on a hot plate at a temperature of 60 to 150° C. for 1 to 10 minutes, preferably 80 to 140° C. for 1 to 5 minutes, to form a resist film of 0.1 to 2.0 μm thick. It is noted in conjunction with spin coating that if the resist composition is coated onto the surface of a substrate which has been wetted with the resist solvent or a solution miscible with the resist solvent, then the amount of the resist composition dispensed can be reduced (see JP-A 9-246173).

A patterning mask having the desired pattern is then placed over the photoresist film, and the film exposed through the mask to an electron beam or to high-energy radiation such as deep-UV, excimer laser or x-ray in a dose of 1 to 200 mJ/cm$^2$, and preferably 10 to 100 mJ/cm$^2$. The high-energy radiation used herein preferably has a wavelength in the range of 180 to 250 nm.

Light exposure may be dry exposure in air or nitrogen atmosphere, EB or EUV exposure in vacuum, or immersion lithography of providing a liquid, typically water between the photoresist film and the projection lens.

The immersion lithography involves prebaking a resist film and exposing the resist film to light through a projection lens, with deionized water or similar liquid interposed between the resist film and the projection lens. Since this allows projection lenses to be designed to a NA of 1.0 or higher, formation of finer patterns is possible. The immersion lithography is important for the ArF lithography to survive to the 45-nm node. The liquid used herein may be a liquid with a refractive index of at least 1 which is highly transparent at the exposure wavelength, typically deionized water or alkane.

The photoresist film formed from the resist composition of the invention has such barrier properties to water that it may inhibit resist components from being leached out in water and as a consequence, eliminate a need for a protective coating in immersion lithography and reduce the cost associated with protective coating formation or the like. The photoresist film has so high a receding contact angle with water that few liquid droplets may be left on the surface of the photoresist film after immersion lithography scanning, minimizing pattern formation failures induced by liquid droplets left on the film surface.

In another version of immersion lithography, a protective coating may be formed on top of the resist film. The resist protective coatings generally include solvent-strippable type and developer-soluble type coatings. A protective coating of the developer-soluble type is advantageous for process simplification in that it can be stripped during development of the photoresist film.

The resist protective coating used in the immersion lithography may be formed from a coating solution, for example, a solution of a polymer having acidic units such as 1,1,1,3,3,3-hexafluoro-2-propanol residues, carboxyl or sulfo groups which is insoluble in water and soluble in an alkaline developer liquid, in a solvent selected from alcohols of at least 4 carbon atoms, ethers of 8 to 12 carbon atoms, and mixtures thereof. The resist protective coating is not limited thereto.

The resist protective coating may be formed by spin coating a topcoat solution onto a prebaked photoresist film, and prebaking on a hot plate at 50 to 150° C. for 1 to 10 minutes, preferably at 70 to 140° C. for 1 to 5 minutes. Preferably the protective coating has a thickness in the range of 10 to 500 nm. As in the case of resist compositions, the amount of the protective coating material dispensed in forming a protective coating by spin coating may be reduced by previously wetting the resist film surface with a suitable solvent and applying the protective coating material thereto.

After exposure to high-energy radiation through a photomask, the resist film is post-exposure baked (PEB) on a hot plate at 60 to 150° C. for 1 to 5 minutes, and preferably at 80 to 140° C. for 1 to 3 minutes.

Where a resist protective coating is used, sometimes water is left on the protective coating prior to PEB. If PEB is performed in the presence of residual water, water can penetrate through the protective coating to suck up the acid in the resist during PEB, impeding pattern formation. To fully remove the water on the protective coating prior to PEB, the water on the protective coating should be dried or recovered by suitable means, for example, spin drying, purging the protective coating surface with dry air or nitrogen, or optimizing the shape of a water recovery nozzle on the relevant stage or a water recovery process.

After exposure, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 10 to 300 seconds, and preferably 0.5 to 2 minutes. A typical developer is a 2.38 wt % TMAH aqueous solution. These steps result in the formation of the desired pattern on the substrate.

Where polymer (A) is used as an additive to a resist material for use with mask blanks, a resist solution is prepared by adding polymer (A) to any one of the aforementioned base resins. The resist solution is coated on a mask blank substrate of $SiO_2$, Cr, CrO, CrN, MoSi or the like. By further forming a SOG film and an organic undercoat film between the photoresist and the blank substrate, there is provided a three-layer structure which is also acceptable herein.

As the base resin of the resist composition for use with mask blanks, novolac resins and hydroxystyrene are often used. Those resins in which alkali soluble hydroxyl groups are substituted by acid labile groups are used for positive resists while these resins in combination with crosslinking agents are used for negative resists. Base polymers which can be used herein include copolymers of hydroxystyrene with one or more of (meth)acrylic derivatives, styrene, vinyl naphthalene, vinyl anthracene, vinyl pyrene, hydroxyvinyl naphthalene, hydroxyvinyl anthracene, indene, hydroxyindene, acenaphthylene, and norbornadiene.

Once the resist coating is formed, the structure is exposed to EB in vacuum using an EB image-writing system. The exposure is followed by post-exposure baking (PEB) and development in an alkaline developer for 10 to 300 seconds.

EXAMPLE

Examples of the invention are given below by way of illustration and not by way of limitation. The abbreviations used herein are GPC for gel permeation chromatography, NMR for nuclear magnetic resonance, Mw for weight average molecular weight, Mn for number average molecular weight, and Mw/Mn for molecular weight dispersity. Mw and Mn are determined by GPC versus polystyrene standards.

Polymer Synthesis Example

Monomers 1 to 10 used in Polymer Synthesis Examples are identified below by their structural formula.

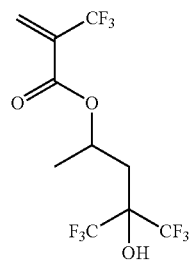

Monomer 1

-continued

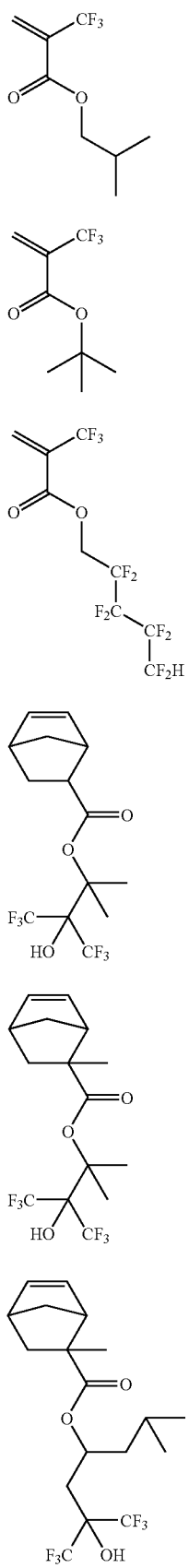

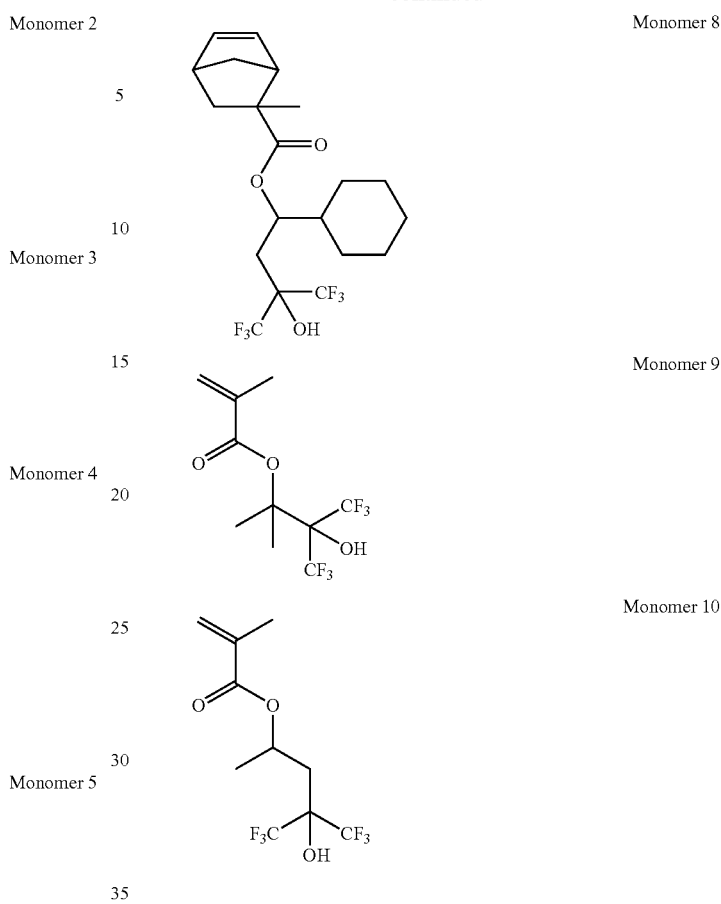

Polymer Synthesis Example 1

Copolymerization of Monomers 1, 2 and 6 (40/30/30)

To a flask in a nitrogen blanket, 45.94 g of Monomer 1, 19.30 g of Monomer 2, 35.55 g of Monomer 6, and 42.9 g of γ-butyrolactone were fed to form a monomer solution, which was kept at a temperature of 20-25° C. With stirring, the solution was heated to 60° C., whereupon 4.51 g of dimethyl 2,2'-azobis(isobutyrate) was added. The polymerization solution was continuously stirred for 24 hours while keeping the temperature at 60° C. At the end of maturing, the solution was cooled to room temperature. To the polymerization solution thus obtained, 300 g of diisopropyl ether and 300 g of ultrapure water were added, followed by 15 minutes of stirring. The water layer was discarded, and the organic layer was washed three times with 300 g of water. The organic layer was concentrated and added dropwise to 1,500 g of hexane. The precipitated copolymer was separated and washed twice with 600 g of hexane, whereupon white solids were isolated. The white solids were vacuum dried at 50° C. for 24 hours, obtaining 53.6 g of the target polymer, Polymer 1. The resin was analyzed for composition by $^1$H-NMR, finding that the copolymer consisted of Monomers 1, 2 and 6 in a ratio of 53/29/18 mol %. The copolymer was also analyzed for molecular weight by GPC, finding Mw of 7,100 and Mw/Mn of 1.4.

Polymer Synthesis Examples 2 to 6

Like Polymer 1, Polymers 2 to 6 were synthesized in accordance with the formulation shown in Table 1 and analyzed by GPC. The results are shown in Table 1.

TABLE 1

| (mol%) | Monomer 1 | 2 | 3 | 4 | 5 | 6 | 7 | 8 | Mw | Mw/Mn |
|---|---|---|---|---|---|---|---|---|---|---|
| Polymer 1 | 40 | 30 |  |  |  | 30 |  |  | 7,100 | 1.4 |
| 2 | 40 | 30 |  | 30 |  |  |  |  | 6,700 | 1.4 |
| 3 | 70 |  |  |  |  |  | 30 |  | 7,500 | 1.4 |
| 4 | 70 |  |  |  |  |  |  | 30 | 7,600 | 1.4 |
| 5 | 40 |  | 30 |  |  | 30 |  |  | 7,200 | 1.4 |
| 6 | 50 |  |  |  | 20 | 30 |  |  | 7,300 | 1.4 |

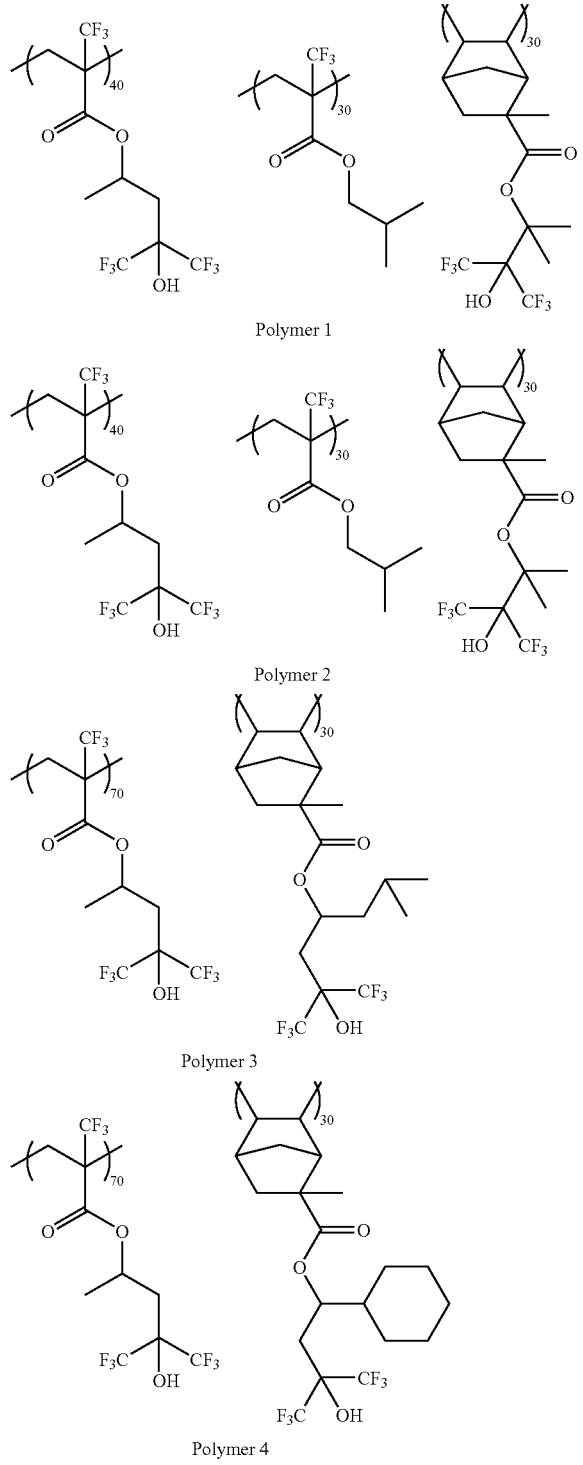

Polymer 1

Polymer 2

Polymer 3

Polymer 4

Polymer 5

Polymer 6

Polymer Synthesis Example 7

Copolymerization of Monomers 1 and 6 (70/30) and Post-Protection Reaction

To a flask in a nitrogen blanket, 73.28 g of Monomer 1, 30.42 g of Monomer 6, and 42.9 g of γ-butyrolactone were fed to form a monomer solution, which was kept at a temperature of 20-25° C. With stirring, the solution was heated to 60° C., whereupon 3.47 g of dimethyl 2,2'-azobis-(isobutyrate) was added. The polymerization solution was continuously stirred for 24 hours while keeping the temperature at 60° C. At the end of maturing, the solution was cooled to room temperature. To the polymerization solution thus obtained, 300 g of diisopropyl ether and 300 g of ultra-pure water were added, followed by 15 minutes of stirring. The water layer was discarded, and the organic layer was washed three times with 300 g of water. The organic layer was concentrated and added dropwise to 1,500 g of hexane. The precipitated copolymer was separated and washed twice with 600 g of hexane, whereupon white solids were isolated. The white solids were vacuum dried at 50° C. for 24 hours, obtaining 50.6 g of the target polymer, Polymer 7'. The resin was analyzed for composition by $^1$H-NMR, finding that the copolymer consisted of Monomers 1 and 6 in a ratio of 72/28 mol %. The copolymer was also analyzed for molecular weight by GPC, finding Mw of 9,000 and Mw/Mn of 1.4.

Next, in a nitrogen atmosphere, a 50 g portion of Polymer 7' was dissolved in 200 g of tetrahydrofuran. With the flask in an ice bath, 4.6 g of triethylamine and 4.6 g of 1-chloro-1-methoxy-2-methylpropane were added to the solution, which was continuously stirred for 10 hours at room temperature. To the flask, 100 g of diisopropyl ether and 150 g of water were added, followed by stirring. After the water layer was separated off, the organic layer was concentrated. The concentrate was added dropwise to 750 g of hexane. The precipitated copolymer was separated and washed twice with 300 g of hexane, whereupon white solids were isolated. The white solids were vacuum dried at 50° C. for 24 hours, obtaining 44.1 g of the target polymer, Polymer 7. The resin was analyzed for percent protection of hydroxyl groups by $^1$H-NMR, finding that 28% of overall hydroxyl groups had been substituted by 1-methoxy-2-methylpropyl groups. The copolymer was also analyzed for molecular weight by GPC, finding Mw of 9,200 and Mw/Mn of 1.4.

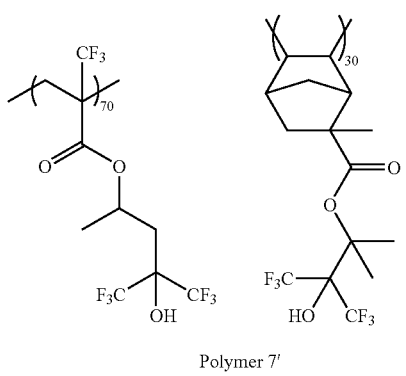

Polymer 7'

Comparative Polymer Synthesis Example 1

Synthesis of Homopolymer of Monomer 9

To a flask in a nitrogen blanket, 100.0 g of Monomer 9, 3.91 g of dimethyl 2,2'-azobis(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for 3 hours while keeping the temperature at 80° C. After the maturing, the solution was cooled to room temperature. The polymerization solution thus obtained was added dropwise to 2,000 g of water, after which the precipitated polymer was filtered. The polymer was washed four times with 600 g of a 9/1 solvent mixture of hexane and isopropyl ether, whereupon white solids were isolated. The white solids were vacuum dried at 50° C. for 20 hours, obtaining 92.8 g of the target polymer, Comparative Polymer 1. The polymer was analyzed by GPC, finding Mw of 7,800 and Mw/Mn of 1.6.

Comparative Polymer Synthesis Example 2

Synthesis of Homopolymer of Monomer 10

A homopolymer of Monomer 10 was synthesized in accordance with the same formulation as in Comparative Polymer Synthesis Example 1. The polymer, Comparative Polymer 2, was analyzed by GPC, finding Mw of 7,900 and Mw/Mn of 1.6.

Evaluation of Resist Coating

Resist solutions were prepared by dissolving 5 g of Resist Polymer (shown below), 0.5 g of an additive polymer selected from Polymers 1 to 7 and Comparative Polymers 1 and 2, 0.25 g of PAG1, and 0.05 g of Quencher 1 in 75 g of propylene glycol monoethyl ether acetate (PGMEA), and filtering through a polypropylene filter having a pore size of 0.2 µm. A control resist solution was similarly prepared without adding the additive polymer.

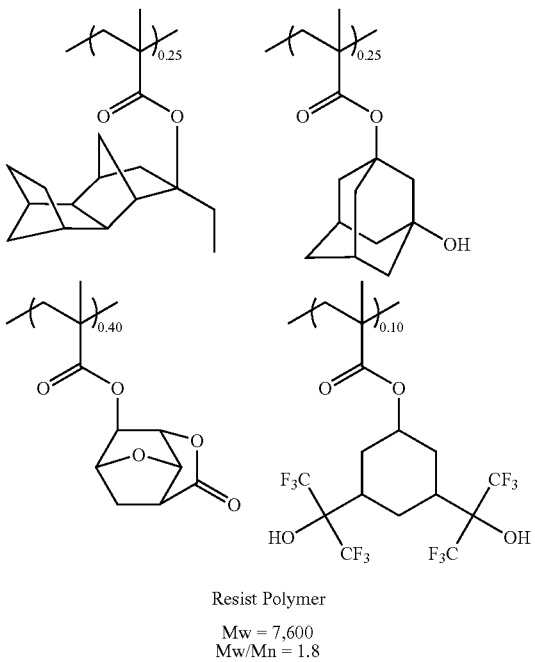

Resist Polymer

Mw = 7,600
Mw/Mn = 1.8

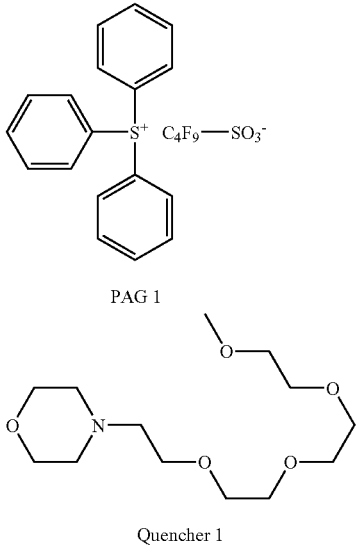

PAG 1

Quencher 1

An antireflective coating ARC-29A (Nissan Chemical Co., Ltd.) of 87 nm thick was formed on a silicon substrate, after which each resist solution was applied onto the ARC and baked at 120° C. for 60 seconds to form a resist film of 150 nm thick.

A contact angle with water of the resist film was measured, using an inclination contact angle meter Drop Master 500 by Kyowa Interface Science Co., Ltd. Specifically, the wafer covered with the resist film was kept horizontal, and 50 µL of pure water was dropped on the resist film to form a droplet. While the wafer was gradually inclined, the angle (sliding angle) at which the droplet started sliding down was determined as well as receding contact angle. The results are shown in Table 2.

A smaller sliding angle indicates an easier flow of water on the resist film. A larger receding contact angle indicates that fewer liquid droplets are left during high-speed scan exposure. It is demonstrated in Table 2 that the inclusion of the additive polymer of the invention in a resist solution achieves a drastic improvement in the receding contact angle of photoresist film without adversely affecting the sliding angle, as compared with the comparative photoresist films containing comparative additive polymers and the control photoresist film.

Also, the resist film-bearing wafer (prepared above) was irradiated through an open frame at an energy dose of 50 mJ/cm$^2$ using an ArF scanner S305B (Nikon Corp.). Then a true circle ring of Teflon® having an inner diameter of 10 cm was placed on the resist film, 10 mL of deionized water was carefully injected inside the ring, and the resist film was kept in contact with water at room temperature for 60 seconds. Thereafter, the water was recovered, and a concentration of photoacid generator (PAG1) anion in the water was measured by an LC-MS analyzer (Agilent). The anion concentration measured indicates an amount of anions leached out for 60 seconds. The results are shown in Table 2.

As is evident from Table 2, the photoresist films formed from the resist solutions having the additive polymers of the invention compounded therein are effective for preventing the PAG component from being leached out in water.

Further, the resist film-bearing wafer (prepared above) was exposed by means of an ArF scanner model S307E (Nikon Corp., NA 0.85, σ 0.93, 4/5 annular illumination, 6% halftone phase shift mask), rinsed for 5 minutes while splashing deionized water, post-exposure baked (PEB) at 110° C. for 60 seconds, and developed with a 2.38 wt % TMAH aqueous solution for 60 seconds, forming a 75-nm line-and-space pattern. The wafer was sectioned, and the profile and sensitivity of the 75-nm line-and-space pattern were evaluated. The results are also shown in Table 2.

It is seen from Table 2 that when exposure is followed by water rinsing, the resist film having the additive polymer of the invention formulated therein formed a pattern of rectangular profile, in stark contrast with the control resist film free of the additive polymer forming a pattern of T-top profile.

TABLE 2

| Additive polymer | Sliding angle (°) | Receding contact angle (°) | Anion leach-out (ppb) | Sensitivity (mJ/cm$^2$) | 75-nm pattern profile |
|---|---|---|---|---|---|
| Polymer 1 | 10 | 81 | 7 | 34 | rectangular |
| Polymer 2 | 10 | 81 | 6 | 35 | rectangular |
| Polymer 3 | 11 | 78 | 7 | 33 | rectangular |
| Polymer 4 | 11 | 78 | 6 | 34 | rectangular |
| Polymer 5 | 10 | 82 | 6 | 35 | rectangular |
| Polymer 6 | 12 | 79 | 7 | 32 | rectangular |
| Polymer 7 | 5 | 90 | 7 | 32 | rectangular |
| Comparative Polymer 1 | 15 | 69 | 7 | 32 | rectangular |
| Comparative Polymer 2 | 13 | 74 | 7 | 33 | rectangular |
| not added | 28 | 40 | 60 | 45 | T-top |

Japanese Patent Application No. 2008-124476 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising (A) a polymer P1 comprising repeat units of the following general formulae (1a) and (2a), (B) a polymer having a structure containing one or both of a lactone ring and a hydroxyl group, and/or a structure derived from maleic anhydride, which polymer becomes soluble in an alkaline developer under the action of an acid, (C) a compound capable of generating an acid upon exposure to high-energy radiation, and (D) an organic solvent,

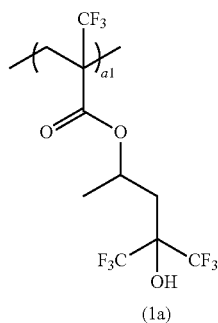

(1a)

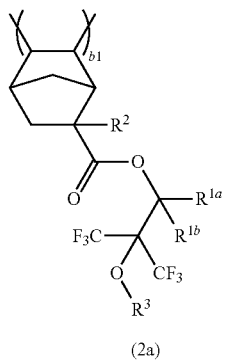

(2a)

wherein $R^{1a}$ and $R^{1b}$ are hydrogen or straight, branched or cyclic $C_1$-$C_{10}$ alkyl, $R^{1a}$ and $R^{1b}$ may bond together to form a non-aromatic ring with the carbon atom to which they are attached, $R^2$ is hydrogen, methyl or trifluoromethyl, $R^3$ is hydrogen or an acid labile group, a1 and b1 are numbers satisfying 0<a1<1, 0<b1<1, and 0<a1+b1≦1.

2. A resist composition comprising (A) a polymer P1' comprising repeat units of the following general formulae (1a), (1b) and (2a), (B) a polymer having a structure containing one or both of a lactone ring and a hydroxyl group, and/or a structure derived from maleic anhydride, which polymer becomes soluble in an alkaline developer under the action of an acid, (C) a compound capable of generating an acid upon exposure to high-energy radiation, and (D) an organic solvent,

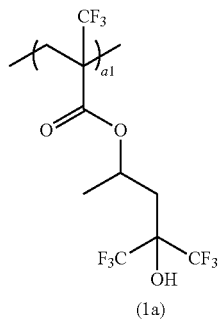

(1a)

-continued

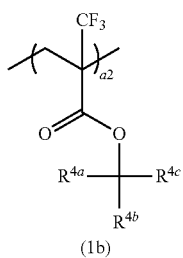
(1b)

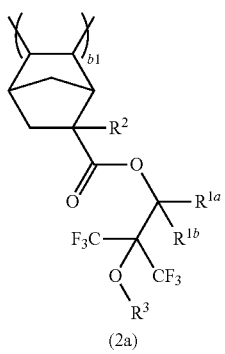
(2a)

wherein $R^{1a}$ and $R^{1b}$ are hydrogen or straight, branched or cyclic $C_1$-$C_{10}$ alkyl, $R^{1a}$ and $R^{1b}$ may bond together to form a non-aromatic ring with the carbon atom to which they are attached, $R^2$ is hydrogen, methyl or trifluoromethyl, $R^3$ is hydrogen or an acid labile group, $R^{4a}$ to $R^{4c}$ are hydrogen or straight, branched or cyclic $C_1$-$C_{10}$ alkyl, and a1, a2 and b1 are numbers satisfying 0<a1<1, 0<a2<1, 0<b1<1, and 0<a1+a2+b1≦1.

3. A resist composition comprising (A) a polymer P1″ comprising repeat units of the following general formulae (1a), (1b), (2a) and (2b), (B) a polymer having a structure containing one or both of a lactone ring and a hydroxyl group, and/or a structure derived from maleic anhydride, which polymer becomes soluble in an alkaline developer under the action of an acid, (C) a compound capable of generating an acid upon exposure to high-energy radiation, and (D) an organic solvent,

P1″

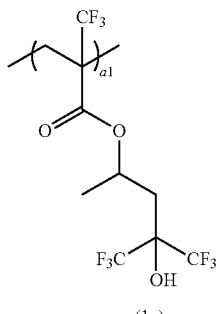
(1a)

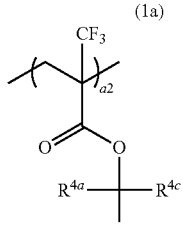
(1b)

-continued

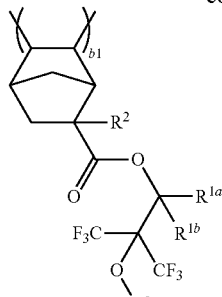
(2a)

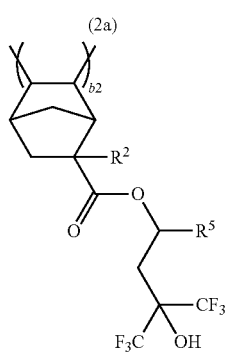
(2b)

wherein $R^{1a}$ and $R^{1b}$ are hydrogen or straight, branched or cyclic $C_1$-$C_{10}$ alkyl, $R^{1a}$ and $R^{1b}$ may bond together to form a non-aromatic ring with the carbon atom to which they are attached, $R^2$ is hydrogen, methyl or trifluoromethyl, $R^3$ is hydrogen or an acid labile group, $R^{4a}$ to $R^{4c}$ are hydrogen or straight, branched or cyclic $C_1$-$C_{10}$ alkyl, $R^5$ is straight, branched or cyclic $C_1$-$C_{10}$ alkyl, and a1, a2, b1 and b2 are numbers satisfying 0<a1<1, 0≦a2<1, 0≦b1<1, 0<b2<1, and 0<a1+a2+b1+b2≦1.

4. A resist composition comprising (A) a polymer P2 corresponding to a polymer P1-H comprising repeat units of the following general formulae (1a) and (2a') wherein some or all of hydroxyl groups in formulae (1a) and (2a') are protected with protective groups, (B) a polymer having a structure containing one or both of a lactone ring and a hydroxyl group, and/or a structure derived from maleic anhydride, which polymer becomes soluble in an alkaline developer under the action of an acid, (C) a compound capable of generating an acid upon exposure to high-energy radiation, and (D) an organic solvent,

P1-H

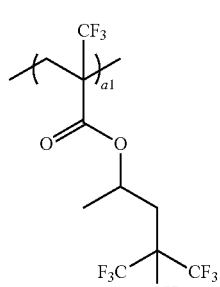
(1a)

-continued

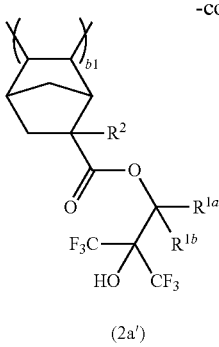

(2a′)

wherein $R^{1a}$ and $R^{1b}$ are hydrogen or straight, branched or cyclic $C_1$-$C_{10}$ alkyl, $R^{1a}$ and $R^{1b}$ may bond together to form a non-aromatic ring with the carbon atom to which they are attached, $R^2$ is hydrogen, methyl or trifluoromethyl, and a1 and b1 are numbers satisfying $0<a1<1$, $0<b1<1$, and $0<a1+b1\leq 1$.

5. The resist composition of claim 1, further comprising (E) a basic compound.

6. The resist composition of claim 1, further comprising (F) a dissolution inhibitor.

7. A pattern forming process comprising the steps of (1) applying the resist composition of claim 1 onto a substrate to form a resist coating, (2) heat treating the resist coating and exposing it to high-energy radiation through a photomask, and (3) developing the exposed coating with a developer.

8. A pattern forming process comprising the steps of (1) applying the resist composition of claim 1 onto a substrate to form a resist coating, (2) heat treating the resist coating and exposing it to high-energy radiation from a projection lens through a photomask while holding a liquid between the substrate and the projection lens, and (3) developing the exposed coating with a developer.

9. A pattern forming process comprising the steps of (1) applying the resist composition of claim 1 onto a substrate to form a resist coating, (2) forming a protective coating onto the resist coating, (3) heat treating and exposing the coated substrate to high-energy radiation from a projection lens through a photomask while holding a liquid between the substrate and the projection lens, and (4) developing with a developer.

10. The process of claim 8 wherein the liquid is water.

11. The process of claim 7 wherein the high-energy radiation has a wavelength in the range of 180 to 250 nm.

12. A pattern forming process comprising the steps of (1) applying the resist composition of claim 1 onto a mask blank to form a resist coating, (2) heat treating and exposing the resist coating in vacuum to electron beam, and (3) developing with a developer.

* * * * *